United States Patent
Landis et al.

(10) Patent No.: US 8,974,215 B2
(45) Date of Patent: Mar. 10, 2015

(54) MOLD FOR THERMAL NANOIMPRINT LITHOGRAPHY, PROCESS FOR FABRICATING THE SAME, AND NANOIMPRINT PROCESS USING THE SAME

(75) Inventors: Stefan Landis, Voiron (FR); Sergio Nicoletti, Sinard (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 157 days.

(21) Appl. No.: 13/227,388

(22) Filed: Sep. 7, 2011

(65) Prior Publication Data

US 2012/0112387 A1 May 10, 2012

(30) Foreign Application Priority Data

Sep. 7, 2010 (FR) ...................................... 10 57112

(51) Int. Cl.
*A01J 21/00* (2006.01)
*G03F 7/00* (2006.01)
*B82Y 10/00* (2011.01)
*B82Y 40/00* (2011.01)

(52) U.S. Cl.
CPC ............... *G03F 7/0002* (2013.01); *B82Y 10/00* (2013.01); *B82Y 40/00* (2013.01)
USPC ........... 425/385; 425/403; 425/406; 425/408; 425/174.4; 264/402; 264/404; 264/319; 264/293

(58) Field of Classification Search
USPC .............. 425/395, 403, 406, 408, 174.4, 385; 264/402, 404, 319, 293
See application file for complete search history.

(56) References Cited

U.S. PATENT DOCUMENTS

| 6,949,199 | B1 | 9/2005 | Gauzner et al. |
| 7,927,089 | B2 * | 4/2011 | Seki et al. ...................... 425/143 |
| 2005/0208171 | A1 | 9/2005 | Seki et al. |
| 2006/0279022 | A1 | 12/2006 | Seki et al. |

(Continued)

FOREIGN PATENT DOCUMENTS

| EP | 1 726 991 | 11/2006 |
| WO | WO 2004/058479 | 7/2004 |
| WO | WO 2004/114017 | 12/2004 |

OTHER PUBLICATIONS

Preliminary Search Report dated Mar. 24, 2011 for French Patent Application No. FR 10 57112, in 1 page.

(Continued)

*Primary Examiner* — Timothy Kennedy
*Assistant Examiner* — David N Brown, II
(74) *Attorney, Agent, or Firm* — Knobbe Martens Olson & Bear LLP

(57) ABSTRACT

A heating mold for thermal nanoimprint lithography is disclosed. According to one aspect, the mold includes a resistive heating element and collecting element for collecting the electromagnetic energy of a variable electromagnetic field emitted by a source located outside the mold. The collecting element being connected to the resistive heating element in which the electromagnetic energy is dissipated. A method for manufacturing the mold, a thermal nanoimprint lithography device including the mold, and a a method for preparing a substrate including a surface nanostructured by a thermal nanoimprint lithography technique using the mold is applied are also disclosed.

28 Claims, 13 Drawing Sheets

(56) References Cited

U.S. PATENT DOCUMENTS

2007/0014920 A1  1/2007  Syms
2009/0026658 A1  1/2009  Hosoda et al.
2010/0065986 A1  3/2010  Nakamura et al.
2010/0072665 A1  3/2010  Imai et al.
2011/0062634 A1  3/2011  Landis et al.
2012/0112387 A1  5/2012  Landis et al.

OTHER PUBLICATIONS

European Search Report dated Nov. 30, 2011 for European Patent Application No. EP 11 17 9917, in 1 page.
European Search Report for European Application No. EP 10 17 6641 dated Nov. 30, 2010.
French Search Report for French Application No. FR 09 56390 dated Feb. 19, 2010.

* cited by examiner

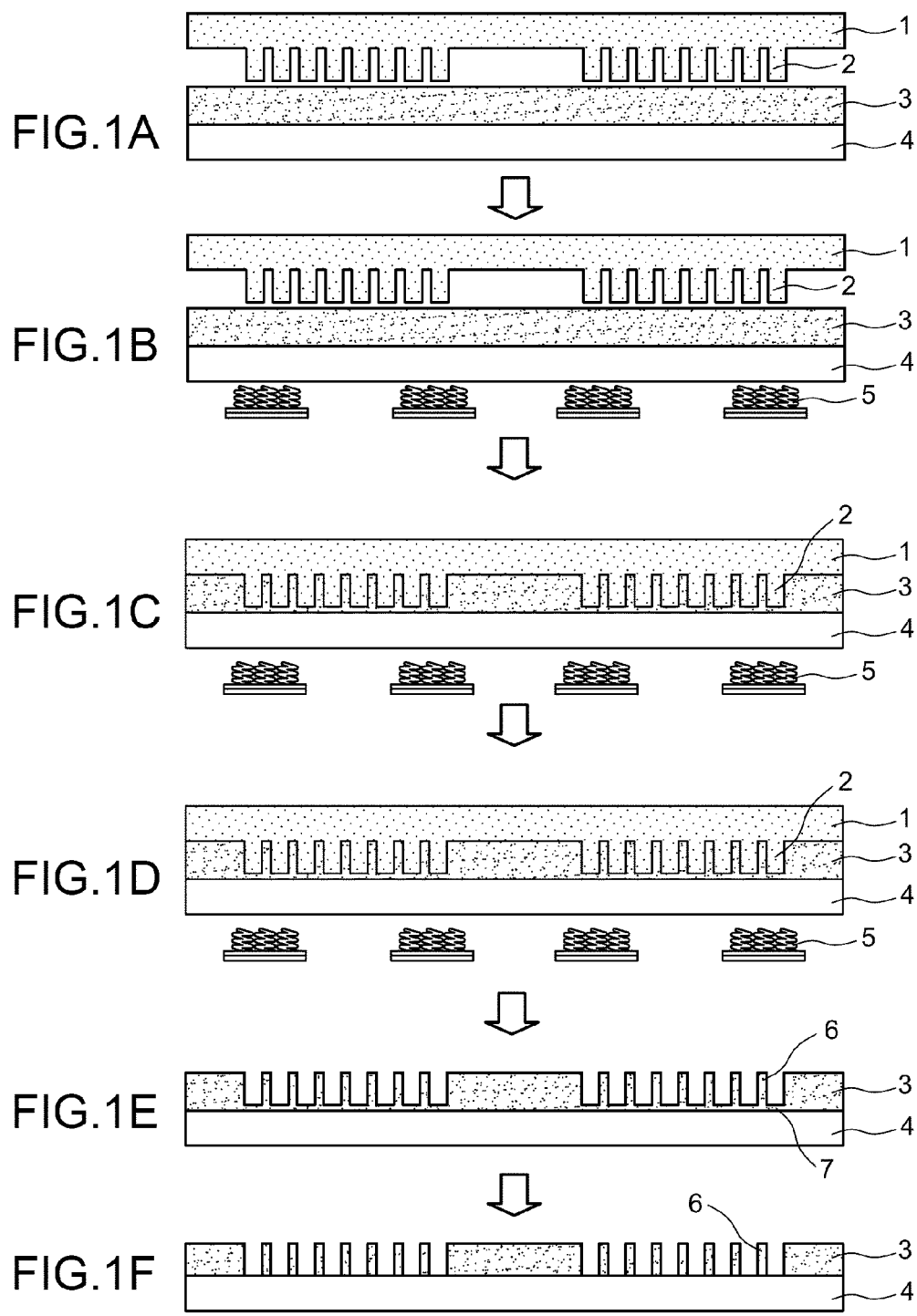

MOLD FOR THERMAL NANOIMPRINT LITHOGRAPHY, PROCESS FOR FABRICATING THE SAME, AND NANOIMPRINT PROCESS USING THE SAME

RELATED APPLICATIONS

This application claims priority to French Patent Application No. 10 1057112 filed Sep. 7, 2010, which is incorporated herein by reference in its entirety.

FIELD OF THE INVENTION

The invention relates to a mold for thermal nanoimprint lithography or thermally assisted nanoimprint lithography.

The invention further relates to a method for preparing this mold.

Finally the invention relates to a thermal nanoimprint lithography method which applies this mold.

CONVENTIONAL ART

The technical field of the invention may be generally defined as that of Nano-Imprint Lithography (or <<NIL>>).

Nano-imprint lithography combines the critical small dimensions of electron beam lithography and the high yield of optical technology (scanner or stepper), and is a cost-effective technique within the scope of applying high definition lithography.

There exist many types of nanoimprint lithography but the most important ones are thermal nanoimprint lithography and UV-assisted nanoimprint lithography.

Thermal Nanoimprint Lithography by thermal nano-printing is the oldest of these techniques and was developed by the team of Professor Stephen Chou in 1995.

The thermal nanoimprint or thermally assisted nanoimprint technique is described in FIGS. 1A to 1F. It applies (FIG. 1A) a rigid mold (1) generally made of silicon or one or its derivatives ($SiO_2$, silicon nitride); made of a polymer; or of nickel, including raised structures, patterns to be duplicated (2) on the one hand and a layer of material (3) such as a thermoplastic polymer or an organic resin deposited on the substrate (4) to be structured on the other hand. The mold is made by conventional lithographic or etching techniques.

The layer material (3) is heated to a temperature above the glass transition temperature or the melting temperature, point of the material, by means of heating elements (5) (FIG. 1B).

The mold (1) and the sample to be printed are then brought into contact and a pressure applied on the back side of the mold (1) allows the latter to be pressed into the heated material layer (3) (FIG. 1C).

At the end of this hot pressing, the temperature of the material is lowered to below the glass transition temperature or the melting temperature of the material, for example by disabling the heating elements (5), in order to set the imprinted structures in the layer of material (FIG. 1D).

It is then proceeded with the removal from the mold, i.e. the separation of the mold (1) from the substrate which bears a layer of material (3) imprinted with the imprinted patterns (6) (FIG. 1E).

Finally, opening of the residual thickness (7) which remains under the imprinted patterns (6) (FIG. 1F) is achieved.

At the end of the thermal nano-printing method, the patterns of the mold are reproduced in the layer of material such as a polymer and may be used as an etching mask.

Patterns from a few nanometers to several microns may thus be made in the material such as a polymer and be subsequently transferred onto the substrate.

After more than ten years of development, this lithographic technique is already being used in some industrial sectors.

In UV-assisted nano-printing (<<Flash Imprint Lithography>> or <<Photo Nano Imprint Lithography>>), a transparent mold, for example made of quartz, is pressed in a solution of monomers or a prepolymer at room temperature, under low pressure. Next, the patterns are set by photopolymerization of the monomers or cross-linking under the effect of UV radiation. This technique is presently being significantly developed because of the possibility of alignment between different levels with the transparent mold.

In all the nanoprinting techniques, the making of the mold is a critical step, since the resolution and the production yield in nanoprinting and nanomolding considerably depend on the quality of the mold used.

In the thermal nanoimprint technique, the mold is made from a bulk, solid, silicon substrate on which patterns are made by standard lithographic technologies (optical, electronic, or with X-rays . . . ) and etching techniques. The thickness of these molds is generally in a range comprised between a few hundred micrometers and a few millimeters for several reasons:
- in order to allow their handling and their positioning on the substrates on the one hand,
- because the quality of the surface of the mold, made with substrates for which the thickness is standard, with conventional micro- and nano-fabrication methods is thus guaranteed and comparable with that of substrates on which the imprint will be made.

As this may be seen in the diagram of the thermal nanoimprint method flow chart of FIG. 1, a step is required for setting the temperature of said mold as well as the temperature of the material to be printed and of the substrate supporting it (FIG. 1B).

Typically, the applied temperatures are comprised between 60° C. and 250° C. They advantageously correspond to the glass transition temperatures (Tg) or melting temperatures (Tf) of the material to be printed (imprint material).

In order to be able to ensure sufficient mechanical stability for removing the mold, i.e. for ensuring the separation of the mold from the material to be printed, it is then necessary to cool the assembly below Tg or Tf. The time required for performing this temperature cycle may attain several minutes or even tens of minutes. Taking into account the duration of the other operations associated with the application of this method, i.e. the coating of the material such as a resin, the contacting and the pressing, the removal of the mold, the duration of this temperature cycle therefore limits the yield of this kind of technology.

Further, with silicon molds which are generally applied in the thermal nano-printing technique, alignment between the patterns on the mold and patterns already made on the plate to be printed, is possible but very difficult.

Indeed, as the silicon mold is not transparent to visible wavelengths, alignment requires the use of a camera so-called camera with two lenses.

Moreover, this alignment cannot be achieved when the mold and the plate, wafer to be pressed are very close, since it must be possible to position the camera. The alignment is therefore necessarily carried out when the distance between the mold and the plate to be pressed is greater than a few centimeters. This constraint therefore limits the alignment capability.

Typically, obtaining an accuracy of the alignment may be expected, located in a range of few hundred nanometers, which is very insufficient for many applications. Therefore, the use of silicon molds limits the field of the application of the thermal nanoprinting technology.

The molds made from a quartz substrate give the possibility of aligning the structures to be printed (imprint structures) with existing structures on the surface of the plate before cross-linking the polymer by UV exposure. But, the making of the mold then remains a problem since, the quartz substrates are more expensive and more difficult to structure on the one hand and the control of the manufacturing processes is not as advanced as for substrates such as silicon wafers, on the other hand.

Another significant limitation of the current thermal nanoprint technology (i.e. with a silicon mold) stems from the fact that the assembly formed by the mold, the material to be printed and the plate, is uniformly heated to a temperature for example comprised between 60° C. and 250° C., independently of the distribution, of the geometry, and of the size of the patterns to be printed.

Now, the penetration rate of a pattern of the mold into the resin is directly related to the size of this pattern and to the viscosity of the pressed material.

A wider pattern will sink in less rapidly than a fine pattern, since the temperature being identical in all the resin layer, its viscosity is also identical in all the film.

These differences between the sinking, penetration rates, of the various patterns will generate mechanical stresses in the mold, and therefore deformations which will become apparent by different residual thicknesses according to the patterns.

These differences in residual thickness are defined by the term of "residual thickness distribution".

The problems due to differences in the sinking rates and to the differences of residual thicknesses are significant limitations of the thermal nanoprinting technology since the subsequent methods for etching the residual thickness may then modify the final dimensions of the obtained objects relatively to the dimensions initially present on the mold.

Document WO-A1-2004/114017 describes a mold 12 for thermal nanoprint lithography which comprises a surface region 14 which includes patterns to be printed (FIGS. 1A to 1D of this document).

The body of the mold is made of an electrically conducting material 16 of low conductivity, for example a semiconductor such as Si or SiC or a metal.

When the mold is pressed against the polymer mass 10, an electric current 18 is caused to simultaneously flow into the body of the mold 12 where heat is thus generated by the Joule effect and this heat is transmitted by conduction to the surface region 14.

The current flow 19 may for example be caused by applying a potential difference or by exposure to a variable magnetic or electromagnetic field.

In FIGS. 2A to 2D of this document, the mold body comprises a layer of electrically conducting material 16 which supports the surface region 14 which includes the patterns to be printed.

In this document, heating is uniform over the whole surface of the mold since the heating layer underlying the elements to be printed is continuous and at least as extended as the printing area. Consequently, with the mold of this document, there is no possibility of local adjustment and optimization of the temperature.

The mold of this document does not provide any solution to the problems of differences in sinking rates and residual thickness differences.

Therefore considering the foregoing, there exists a need for molds for thermally assisted nanoprint lithography, or more simply molds for thermal nanoprint, which provide a solution to the problems of differences in sinking rates and of differences in residual thicknesses of the molds of the prior art.

Further there exists a need for molds for thermally assisted nanoimprint lithography or more simply for thermal nanoprint, which require a low supply of energy for attaining the working temperature, which have low thermal inertia and with which may be achieved heating cycles, rise in temperature, cooling, lowering of temperature, for which the duration is as short as possible.

There also exists a need for molds for thermal nanoprint which are easy to make, easy to handle, of small volume, which have excellent surface quality and excellent resolution.

SUMMARY AND DESCRIPTION OF ASPECTS OF THE INVENTION

The goal of the present invention is to provide a mold for thermal nanoprinting lithography which inter alia meets the needs listed above.

The goal of the present invention is further to provide a mold for thermal nanoprinting lithography which does not have the drawbacks, defects, limitations and disadvantages of the molds of the prior art and which solves the problems of the molds of the prior art.

This goal and further other ones are achieved according to the invention in a first embodiment thereof, by a heating mold for thermal nanoimprint lithography comprising:

- a substrate (21) including a first main surface (22) and a second main surface (23), said first main surface (22) being optionally at least partly covered with a first membrane (29), and a second electrically and thermally insulating membrane (30) lying through a first of its sides (faces) (31) on said second main surface (23) and covering at least partly said second main surface (23);
- optionally, a thermally conducting layer (33), for mechanically supporting the second membrane (30) over at least one portion of said first side (face) (31) of the second membrane (30) and above said substrate;
- optionally, an insulating layer under said thermally conducting and mechanically supporting layer (33);
- resistive heating means (34) on the other one of the sides (faces) (35) of said second membrane (30) in an area of said second membrane (30);
- an electrically and thermally insulating layer (36) which covers said heating means (34) and at least partly said second membrane (30);
- patterns to be printed (37) on said electrically and thermally insulating layer (36) in an area of the surface of said electrically and thermally insulating layer (36) above said heating means (34);
- collecting means for collecting the electromagnetic energy of a variable electromagnetic field emitted by a source located outside the mold, said collecting means being connected to said resistive heating means (34) in which said energy is dissipated.

This goal, and further other ones are achieved, according to the invention in a second embodiment thereof, by a heating mold for thermal nanoprinting lithography comprising:

- one substrate (21) including a first main surface (22) and a second main surface (23), and a through-cavity (24) extending from a first orifice (27) in the first main surface (22) as far as a second orifice (28) in the second main surface (23), said first main surface (22) being optionally at least partly covered with a first membrane (29) totally or partly obturating said first orifice (27) or else leaving said first orifice (27) clear, and said second orifice (28) being totally obturated by a second electrically and thermally insulating membrane (30) lying through a first of its sides (faces) (31) on said second main surface (23) and covering at least partly said second surface (23);

optionally, a thermally conducting layer (33) mechanically supporting the second membrane (30) on said first side (face) (31) of the second membrane (30) above (32) said second orifice (28);

optionally, an insulating layer under said thermally conducting and mechanically supporting layer (33);

resistive heating means (34) on the other one of the sides (faces) (35) of said second membrane (30) in an area of said second membrane (30) above said second orifice (28);

an electrically and thermally insulating layer (36) which covers said heating means (34) and at least partly said second membrane (30);

patterns to be printed (37) on said electrically and thermally insulating layer (36) in an area of said electrically and thermally insulating layer (36) above said second orifice (28);

collecting means for collecting the electromagnetic energy of a variable electromagnetic field emitted by a source located outside the mold, said collecting means being connected to said resistive heating means (34) in which said energy is dissipated.

The mold according to the invention both in its first embodiment and its second embodiment, has never been described nor suggested in the prior art.

The mold according to the invention inter alia meets the needs listed above for molds for thermal nanoprinting lithography, meets all the criteria and requirements for this type of mold, does not have the drawbacks, defects, limitations and disadvantages of the molds of the prior art and provides a solution to the problems posed by the molds of the prior art.

The mold according to the invention both in the first embodiment and in the second embodiment, has, as first main characteristic, collecting means for collecting the electromagnetic energy of a variable electromagnetic field emitted by a source located outside the mold, these collecting means being connected to said resistive heating means in which said energy is dissipated.

The resistive means for heating the mold according to the invention receive the energy which is necessary to them without being connected through means such as electric cables, to power supply devices outside the mold. Consequently, the mold according to the invention does not comprise any electric connections, interconnections, passing between the mold and the printing head.

The integration of the mold according to the invention in already existing equipment is thus considerably facilitated. The manufacturing of the mold according to the invention is also much simpler, much shorter and less costly.

The mold according to the invention has, as a second main characteristic, heating means integrated onto a membrane, which may be described in the second embodiment as a <<suspended membrane>> which is intended to receive structures, patterns which will be subsequently printed in a layer of material such as a thermoplastic polymer or resin.

These structures, patterns have sizes which may vary from a few nanometers to several micrometers.

The mold according to the invention, notably because it has a small volume and because its total volume is reduced and limited to the assembly of a membrane, a heating element and of nano- or micro-structures, requires reduced supply of energy for attaining the working temperature. The heating and cooling time is also significantly reduced, which considerably improves the rapidity of the method, its capacity, its yield, and its cost.

Typically, the duration of a heating (for attaining a temperature comprised for example between 100° C. and 200° C.) and cooling (in order to lower down the temperature for example to 30° C.) cycle passes from a few minutes, or even a few tens of minutes, to a few seconds.

As indicated below, the mold generally comprises several groups of patterns to be printed which differ by their shape and/or their size.

Because the heating elements of the mold according to the invention may be adapted to each group of patterns notably by modifying the size and/or the shape and/or the density of the heating elements according to the shape and/or the size of the patterns to be printed of each of the groups, this allows groups of patterns to be heated to different temperatures and therefore the viscosity of the layer, of the polymer, resin film to be printed may be locally adjusted in order to ensure homogeneous sinking of the mold into the resin or polymer.

Thus, for example, <<fine>> patterns may be heated to a lower temperature than <<wide>> patterns and the fine patterns and the wide patterns may sink into the resin at the same rate, the mold will therefore be subjected to less deformations and the residual thickness distribution will be more homogeneous.

It is specifically the simplified method for supplying energy to the means for heating the mold according the invention, which, by suppressing any wiring between the mold and the outside of the latter, gives the possibility of accurately, individually, adjusting the temperature of each of the heating elements while this would have been impossible in the methods of the prior art considering the number of connections and through passages which would have been required.

Advantageously, said first (22) and second (23) main surfaces may be planar and parallel.

Advantageously, said first (22) and second (23) main surfaces may be horizontal, and the first main surface (22) may then be defined as a lower surface and the second main surface (23) may then be defined as an upper surface.

Advantageously, the mold according to the invention may further comprise positioning, alignment marks (39, 40).

Advantageously, said alignment marks are located in the second membrane layer (30) and/or in the electrically and thermally insulating layer (36) and/or on said electrically and thermally insulating layer (36) in the vicinity of said patterns to be printed (37).

These alignment, positioning marks (39) allow fine alignment, positioning of the patterns to be printed (37), supported by the mold relatively to a reference level and to patterns already made on the sample to be printed.

A fine alignment, i.e., with a deviation of less than 100 nanometers is thus made possible, which was not hitherto available with bulk, solid, silicon molds currently used in thermal nanoprinting lithography.

Advantageously, said means for collecting the electromagnetic energy consist of one or more radiofrequency receiver(s) or antenna(s) for collecting radio frequencies or RF.

In a first embodiment of the resistive heating means and collecting means, said resistive heating means and said collecting means may be distinct, separate, different, remote from each other and connected through means for conveying energy.

Thus, said collecting means may be located in a same plane as said resistive heating means, on the other one of the sides (faces) (35) of said second membrane (30) and outside the area where said resistive heating means are located, or else said collecting means may be located in a plane different from that of said resistive heating means.

In a second embodiment, said resistive heating means and said collecting means may be merged.

Advantageously, said resistive heating means and said collecting means when they are merged, appear in the form of one or several heating and collecting pattern(s) such as one or several resistive collecting loop(s).

It should be noted that in these merged collecting and heating means, the collecting stems from the shape of the pattern, such as a loop, and the heating stems from transport properties of the patterns.

These collecting and heating properties are of course further influenced by the dimension of these patterns.

Advantageously, the resistive heating means or the coinciding resistive heating means and collecting means comprise several discrete, distinct heating elements separated from each other by said electrically and thermally insulating layer (36) and/or the second membrane (30) and the shape and/or the size and/or the density of said heating elements are selected so as to be able to locally adjust, set the heating temperature of the surface of said layer (36) and of the patterns to be printed (37) found (located) on this surface.

Advantageously, the patterns to be printed (37) comprise patterns to be printed with different sizes found (located) on different areas of the surface of the layer (36), and the shape and/or the size and/or the density of the heating elements (34) is (are) then selected so that the areas of the surface of the layer (36) on which patterns to be printed of a relatively larger size are found (located), are heated to a higher temperature than the areas of the surface of the layer (36) on which patterns to be printed of a relatively smaller size are found (located).

Advantageously, said collecting means are made of a material which is not very resistive, preferably selected from Cu, Al, Pt, Ta, TiN and from all the other conducting materials compatible with micro- and nano-manufacturing processes.

By a not very resistive material, is generally meant that its resistivity is of the order of 1 to 10 µOhms.cm. Such a resistivity generally corresponds to the average conductivity of a metal.

Generally, the coinciding collecting/heating means and the heating means are made of a same conducting material, and the section of the conductor is changed in order to either dissipate the heat or not.

Advantageously, the substrate may be made of a material selected from materials compatible with micro- and nano-manufacturing technologies, processes, such as silicon, silicon oxide, silicon nitride, germanium, sapphire, GaAs and generally all the materials compatible with technologies dedicated to microelectronics and to microtechnologies (for example MEMS); and composite materials comprising several of these materials.

Advantageously, the first and second membranes (29, 30) may be made of a material selected from materials which withstand anisotropic etching of the material of the substrate, such as $Si_3N_4$ or $SiO_2$, if the substrate is made of Si.

Advantageously, the resistive heating means (34) may be made of a material selected from platinum, tantalum, tungsten, titanium nitride, doped and preferably strongly doped monocrystalline or polycrystalline silicon and generally all the conducting materials compatible with technologies dedicated to microelectronics and to microtechnologies, in other words micro- and nano-manufacturing technologies.

Advantageously, the electrically and thermally insulating layer (36) is made of a material selected from $SiO_2$, $Si_3N_4$, $Al_2O_3$, $HfO_2$ and all the electrically and thermally insulating materials compatible with micro- and nano-manufacturing technologies.

Advantageously, the patterns to be printed (37) are made of a material selected from Si, $SiO_2$, $Si_3N_4$, $Al_2O_3$, and $HfO_2$, and all the materials compatible with micro- and nano-manufacturing technologies.

The invention further relates to a device for by thermal nanoimprint lithography comprising a printing chamber inside which are found (located):
  a mold according to the invention as described in the foregoing, comprising patterns to be printed, said mold being supported by a piston;
  a plate support, optionally a heating support, capable of supporting a plate made of polymer or resin facing said patterns to be printed of said mold;
  and at least one source which emits an electromagnetic field.

Advantageously, at least one source is integrated into the piston and/or at least one source is integrated into the plate support, and/or at least one source is positioned in the printing chamber outside the mold, the piston and the plate support.

The invention also relates to a method for making a mold according to the first embodiment of this mold, as described above, wherein the following successive steps are carried out:
  a) a substrate (21) including a first main surface (22) and a second main surface (23) is provided;
  b) optionally, a thermally conducting and mechanically supporting layer (33) is formed in an area of the second main surface (23) of the substrate (21);
  c) optionally, a first membrane (29) is deposited on said first main surface (22);
  d) a second electrically and thermally insulating membrane (30) is deposited on said second main surface (23);
  e) a resistive heating and electromagnetic energy collecting layer is deposited on an area of the second membrane (30) above the thermally conducting and mechanically supporting layer (33);
  f) the resistive heating and electromagnetic energy collecting layer is shaped;
  g) an electrically and thermally insulating layer (36) is deposited on said shaped resistive heating and electromagnetic energy collecting layer (34) and on the second membrane (30);
  h) patterns (37) to be printed are made on said electrically and thermally insulating layer (36).

The invention further relates to a method for making a mold according to the second embodiment of this mold, as described above, wherein the following successive steps are carried out:
  a) a substrate (21) including a first main surface (22) and a second main surface (23) is provided;
  b) optionally, a thermally conducting and mechanically supporting layer (33) is formed in an area of the second main surface (23) of the substrate (21);
  c) optionally, a first membrane (29) is deposited on said first main surface (22);
  d) a second electrically and thermally insulating membrane (30) is deposited on said second main surface (23);

e) a resistive heating and electromagnetic energy collecting layer is deposited on an area of the second membrane (30) above the thermally conducting and mechanically supporting layer (33);

f) the resistive heating and electromagnetic energy collecting layer is shaped;

g) an electrically and thermally insulating layer (36) is deposited on said shaped resistive heating and electromagnetic energy collecting layer (34) and on the second membrane (30);

h) patterns to be printed (37) are made on said electrically and thermally insulating layer (36);

i) optionally, the first membrane is etched, and then a cavity (24) is formed in the substrate (21) from a first orifice (27) in the first main surface (22) as far as the thermally conducting and mechanically supporting layer (33) in an area of the second main surface (23).

Optionally, alignment, positioning marks (39, 40), are made in the membrane layer (30) and/or in the insulating layer (36) and/or on said electrically and thermally insulating layer (36) in the vicinity of the patterns to be printed (37).

Finally the invention relates to a method for preparing a substrate comprising a surface nanostructured by a thermal nanoimprint lithography technique in which the mold as defined earlier is applied.

Such a method is fundamentally distinguished from the methods of the prior art because of the application of the specific mold according to the invention and has all the advantages inherently related to this mold and most of which have been mentioned above.

While the present invention is described herein in connection with certain embodiments, it is to be understood that the invention is not limited to the disclosed embodiments, but, on the contrary, is intended to cover various modifications and equivalent arrangements included within the spirit and scope of the appended claims, and equivalents thereof.

The invention will be better understood upon reading the detailed description which follows, given as an illustration and not as a limitation, with reference to the appended drawings wherein:

BRIEF DESCRIPTION OF THE DRAWINGS

FIGS. 1A to 1F are schematic vertical sectional views, which illustrate the successive steps for making a nanostructured substrate by a thermal nano-imprint method;

DETAILED DESCRIPTION OF CERTAIN EMBODIMENTS

First of all let us specify that in the whole of present description, the terms such as <<over>>, <<above>> for defining the position of a first element of the mold relatively to a second element do not mean that the first element is at a higher altitude than the second element in a vertical plane, but rather simply have the purpose of describing the relative position of the first element relatively to the second element without both of these elements being necessarily located in a vertical plane. The same applies for the terms of <<under>> and <<below>> and for the terms of <<upper>> and <<lower>>.

Figure 2A:
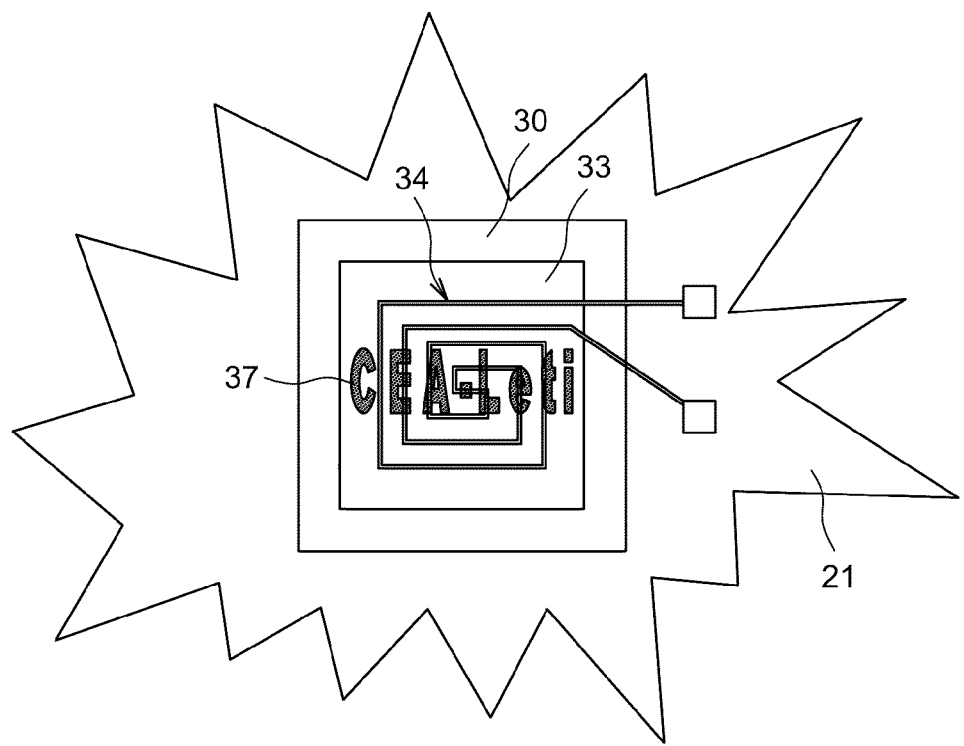
FIG. 2A is a schematic top view of a heating mold according to the invention, in the second embodiment thereof.
Figure 2B:
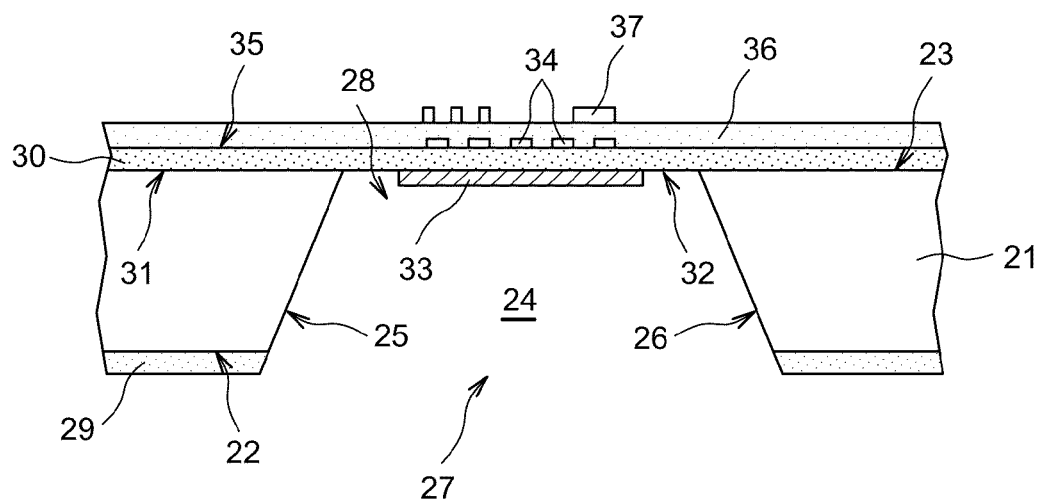
FIG. 2B is a schematic vertical sectional view of a heating mold according to the invention, in the second embodiment thereof.

We shall begin by describing for convenience, the second embodiment of the mold according to the invention which is illustrated in FIGS. 2A and 2B.

This mold comprises a substrate (21) including a first main surface (22) and a second main surface (23).

In FIG. 2B, the first (22) and second (23) main surfaces are planar, parallel and horizontal. The first main surface (22) may therefore be defined as a lower surface, while the second main surface (23) may be defined as an upper surface. It is quite understood that this arrangement of the first main surface (22) and of the second main surface (23) is only given as an example and that other arrangements of both of these surfaces may be contemplated.

The substrate (21) may thus have the shape of a plate or platelet, wafer, comprising two planar, parallel, for example square, rectangular or further circular surfaces (22, 23).

The thickness of the substrate (21), i.e. the distance between the first main surface (22) of the substrate (21) and the second main surface (23) of the substrate (21) is typically comprised between 350 and 735 μm depending on the thickness of the selected substrate.

The substrate (21) may be made of any material compatible with micro- and nano-manufacturing processes, such as silicon, silicon oxide, silicon nitride, germanium, sapphire, GaAs, and composite materials comprising several of these materials.

A preferred material is silicon.

A through-cavity (24) defined by sidewalls (25, 26) extends into the substrate (21) from a first orifice (27) in the first main surface (22) as far as a second orifice (28) in the second main surface (23).

This cavity (24) and therefore both orifices (27, 28) generally have a circular or rectangular section depending on the selected manufacturing processes and the second orifice (28) generally has a size smaller than or equal to the size of the first orifice (27). For example, the second orifice (28) generally has a diameter smaller than the diameter of the first orifice (27) notably if etching is anisotropic and accomplished via a wet route.

As this is illustrated in FIG. 2B, the cavity (24) may thus have the shape of a frustum, the side walls (25, 26) of which converge from the first main surface (22) as far as the second main surface (23).

However, the fact that the cavity (24) has oblique side walls (25, 26) does not have any particular benefit and other configurations may be contemplated for the side walls (25, 26) of the cavity (24).

The first main surface (22) is optionally covered with a first membrane (29) (in the figures, this is a lower membrane).

This first membrane (29) when it is present, may totally or partly cover the first main surface (22) of the substrate, and may either leave the first orifice (27) totally clear, or totally or partly obturate said first orifice.

In FIGS. 2A, 2B, 3A, 3B, 3C as an example, an embodiment is illustrated, wherein the first membrane (29) leaves said first orifice (27) clear. In other words, this first membrane (29) totally or partly covers said first surface (22) but does not obturate said first orifice (27) and does not extend beyond the edges of the latter.

The first membrane (29) is not essential, it is not strictly speaking a membrane but a mask with which etching of the substrate may be facilitated in order to have the recess or cavity (24).

The cavity (24) in the mold according to the invention, may in this second embodiment be defined as a recess in the case when the first orifice (27) is left clear (as in FIGS. 2B, 3B, 3C) or is only partly obturated. But this configuration of the cavity (24) as a recess is however not mandatory, i.e. the cavity (24) may be closed on either side, which is the case when the membrane (29) covers, totally obturates the first orifice (27).

A configuration of the cavity as a recess is useful when there are alignment marks for positioning the structure.

In this case it would be possible to see through the recess when the structure is positioned.

If the alignment does not exist, the recess is not relevant. In this case, a closed cavity (24) is preferred and not a through-recess.

The second orifice (28) is obturated by a second membrane (30) (in FIGS. 2B, 3B and 3C, this is an upper membrane) which lies through one of its faces, sides (31), i.e. the lower face, side, in the case of FIG. 2B, on said second main surface (23) of the substrate (21).

This second membrane (30) totally or partly covers said second surface (23).

The second membrane (30) may be defined as a support on which is positioned the layer (36) containing the heating means (34) and which is surmounted by the patterns (37). This membrane (30) is electrically and thermally insulating since the heating elements (34), which generally have to be rather close to the patterns (37) are embedded in this membrane (30) and/or in the layer (36).

It is equivalent, both from the point of view of the making of the mold and from the point of view of its use, that the heating elements (34) be embedded in the membrane (30), or else the heating elements be embedded in the layer (36).

A generally crucial point is that the upper surface of the layer (36) is planar.

By <<rather close>>, is generally meant that the heating elements (34) are generally located at a distance of one to a few nanometers (for example 2, 3, 5, 10, 20) up to 100, to a few hundred nanometers (for example 200, 300, 500, 1000, 2,000 nm) from the patterns (37).

Said first and second membranes (29, 30) generally have a thickness from 100 to 200 nm.

These first (29) and second (30) membranes are generally made of a material selected from electrically and thermally (heat) insulating materials which withstand etching of the substrate, in particular from materials which withstand anisotropic etching of the silicon substrate, such as $Si_3N_4$ or $SiO_2$.

The first (29) and second (30) membranes may also appear as several layers ("multilayer"), each of these layers being for example made of one of the aforementioned materials.

It should be noted that the membrane (30) is not necessarily used for stopping etching but it may advantageously be used for this purpose.

The free portion (32) of the lower side, face (31) of said second membrane (30), on the side of the second orifice (28), and which therefore does not lie on the second main surface (23) of the substrate (21) optionally includes a thermally (heat) conducting layer (33).

This layer (33) is generally made of a material selected from Si, metals and semiconductors, for example the layer (33) may be made of Si or of TiN. The layer (33) generally has a thickness from 500 nm to 5 μm.

The layer (33) is not essential. The layer (33) is thermally conducting and not insulating in order to homogenize and uniformly distribute heat over the whole surface below the heating means (34).

It may be desirable to add an insulating layer (not shown) underneath this layer (33) in order to limit and even avoid convection and so that the heat does not diffuse too much into the substrate (21).

This first layer (33) covers generally only a fraction of the free portion (32) of the lower face, side (31) of the second membrane (30), and it is generally placed at the centre of said free portion, and correspondingly at the centre of said second orifice (28). Further, the layer (33), placed in this way may cover only some areas of the free portion (32) of the lower face, side of the second membrane (30) in order to uniformize the heat only over some areas of the surface specifically below the heating means.

Heating means (34) are deposited on the other one of the faces, sides (35) of said second membrane (30), in an area of said second membrane (30) above said second orifice (28) of the cavity (24) and above said first optional layer (33). These heating elements, means (34), are generally composed of a resistive heating layer covering at least partly said area. This resistive heating layer (34) generally has a thickness from 10 to 500 nm.

This resistive heating layer generally has determined patterns, a determined shape, geometry in the plane of the layer and this layer generally includes several heating means, preferably discrete, distinct, separate heating elements.

The exact position of the resistive heating elements (34) which may also be called heating circuits or resistive circuits, their shapes, their geometries and their dimensions, sizes and surface density may be easily determined by the man skilled in the art possibly resorting to simulation experiments.

The dimensions of the heating elements (34) depend in particular on the thermal properties of the materials of the mold and of the material to be printed such as a resin as well as on the maximum temperature to be attained and on the density and on the shape of the patterns to be printed.

The heating elements (34) may be in any conducting material, but preferred materials are platinum, tantalum, tungsten, titanium nitride, mono- or poly-crystalline (doped) silicon for their electric properties and their compatibility with micro- and nano-manufacturing technologies.

If a homogeneous temperature is desired over the whole area of the surface of the mold located above the heating elements, i.e. the central region where the patterns to be printed are localized, such a homogeneous temperature may be obtained by optimizing the geometry of the heating element. The geometry of the heating element shown in FIG. 2A is an example of such an optimized geometry allowing a homogeneous temperature to be obtained.

A homogeneous temperature is also obtained thus over the whole thickness of the membrane (30).

However, according to the invention, it is indeed sought to obtain a suitable temperature, different for each of the different areas of the surface of the mold which are found (located) above the heating elements, these different areas of the surface bearing for example patterns to be printed which differ by their size and/or their shape. More specifically, it is sought to obtain a relatively higher temperature in the areas of the surface of the mold which bear relatively bigger or wider patterns to be printed relatively to the areas of the surface of the mold which bear relatively smaller or finer patterns.

In the following, the reasons are explained for which the heating elements are dimensioned, and then how the heating elements may be dimensioned.

The viscosity of the materials used for nanoimprint is a heat-dependent property, i.e. the viscosity ($\eta$) depends on the temperature (T).

For thermoplastic materials which make up the majority of the materials used in nanoimprint, the so-called WLF law (1) properly describes this dependency:

$$\frac{\eta(T)}{\eta_e} = \exp\left(-c_1 \frac{T-T_s}{c_2+T-T_s}\right) \quad (1)$$

wherein $T_s=T_g$ (Glass Transition Temperature of the material)+50K and $\eta_s=\eta(T_s)$, and $c_1$ and $c_2$ are adjustment variables which may be determined experimentally.

Figure 5:
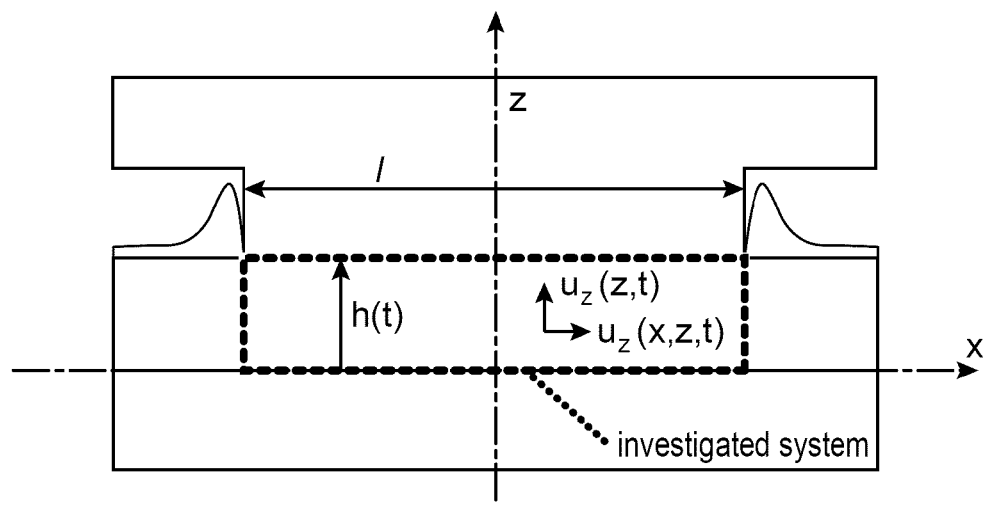
FIG. 5 is a schematic vertical sectional view which shows the printing of an (infinitely long) line with a width l on which a pressure p is applied in a film of thickness h and of viscosity η.

It is also known that for an (infinitely long) line of width l on which a pressure p is applied along the z axis (the axis z is perpendicular to the surface of the mold), and the printing of which is sought in a film of thickness h and of viscosity $\eta$ (see FIG. 5), the sinking rate of this line ($\partial_t h$) is given by the following relationship (2):

$$\frac{p}{l^2} = \eta \cdot \frac{-\partial_t h}{h^3}. \quad (2)$$

It is therefore seen that the sinking rate is proportional to 1/(viscosity×width squared). Therefore, if the viscosity is constant in the resin from pattern to pattern, which is the case herein, the sinking rates will be very different.

By selecting for each pattern the temperature of this pattern for which the product $\eta l^2$ is constant, a sinking rate of the patterns is obtained which is the same regardless of their size (fineness, width). The residual thickness distribution is then considerably improved.

The energy transfer principle by electromagnetic coupling and more particularly by RF coupling is governed by Neumann's Law:

$$R \cdot i = -\frac{d\phi(B)}{dt} \quad (3)$$

wherein R is the electric resistance of the conductor (here of the collecting loop), i is the current and $\phi$ is the flux of the magnetic field B through the surface delimited by the conductor, i.e. the collecting means, such as the collecting circuits or antennas of the mold according to the invention.

In a variable magnetic or electromagnetic field, for example a radiofrequency field RF, the power W transferred towards a conducting circuit, such as a heating element, of resistance R is defined by $$W = \frac{1}{R}\left(\frac{d\phi(B)}{dt}\right)^2. \quad (4)$$

This power depends on the surface delimited by the collecting circuit and on the characteristics (intensity and frequency) of the electromagnetic field. For each collecting loop, the amount of drawn energy is proportional to its surface area.

Accordingly, the temperature of the patterns to be printed may easily be locally controlled by suitable dimensioning of the resistive heating circuit, element, and of the electromagnetic field collecting circuit, element, in other words of the collecting antenna, associated with this resistive circuit, element.

The field collecting function and the resistive heating function may be separate and ensured by different, distinct, separate elements or else both of these functions may be grouped, associated in a single and same element, a single and same structure.

In other words, the electromagnetic circuit, for example the radiofrequency circuit of the mold may be made according to two configurations:

First configuration: The electromagnetic circuit consists of collecting means comprising one or more collecting element(s) (therefore having a very low resistivity), for example one or more antenna(s) for collecting the electromagnetic field, and heating means separate, distinct different from said collecting means, comprising one or several highly resistive heating element(s), slightly conductive for dissipating heat at. the desired locations, each collecting element may be connected to a single heating element or to several heating elements via means for conveying the collected energy from the collecting means to the resistive heating means.

Advantageously one or several elements for collecting the electromagnetic field may be made such as antennas, loops, at the same level as the heating elements, circuits, i.e. in the same plane parallel to the surface of the sample, on the face, side (35) of the membrane (30).

Or else, the collecting element(s) on the one hand and the resistive heating elements on the other hand may be in two different planes and it is then possible to make metal circuits or <<vias>> which have a very low resistivity for connecting the collecting loop(s), element(s) to the heating elements, dissipation loops.

Such metal circuits or vias may be made of the same material as the collecting loops but not necessarily. For example for the vias on the one hand and for the collecting circuits on the other hand, two metals may be selected with different resistivities so that the dissipation of heat is better near the patterns to be printed.

Generally, such metal circuits do not exist, in the case when the heating elements and the collecting elements are in the same plane.

If the heating elements and the collecting elements are not in the same plane, the heating elements are generally located on the face (35) of the membrane (30) and the collecting elements are generally located in the membrane (30), for example on the face (31) of the substrate underneath the heating elements (34) and above the optional layer (33).

With this first configuration it is possible to decouple the collecting and the heated area and possibly move them away from each other if necessary.

The collecting elements, having a very low resistivity, and highly conductive may be made of a metal preferably selected from Cu, Al, Pt, and all the conducting metals compatible with the micro- and nano-manufacturing processes.

The heating elements which are highly resistive and weakly conductive may be made of a material selected from platinum, tantalum, tungsten, titanium nitride, doped monocrystalline or polycrystalline silicon, and generally all the conductive materials compatible with technologies dedicated to microelectronics and to microtechnologies, in other words the micro- and nano-manufacturing technologies.

Second configuration: The electromagnetic circuit exclusively consists of collecting elements such as collecting loops which are therefore resistive, and these elements such as loops are used both for collecting and dissipating energy. That is to say that the collecting means and the resistive heating means coincide in this case.

The term of loop is used but without it being limiting by any means. Any geometry allowing collection of the electromagnetic field such as an RF field may be used.

These loops do not necessarily have an annular shape, preferably a circular shape and other shapes, for example, polygonal shapes, may be contemplated.

In the second configuration, the material which constitutes the merged heating means and collecting means, is selected from materials which constitute the heating means already mentioned above.

The second configuration is much simpler to apply than the first configuration.

Both in the first and in the second configurations, in order to act on the resistivity of the different conducting elements thereby forming the collecting loop and/or the dissipating elements, materials of different resistivity (having a low resistivity for the collecting loop, but highly resistive for the dissipation loops) may be used and/or the shape of the conducting patterns (a large section for conducting lines having a low resistivity and a small section for more resistive structures) may be optimized.

Figure 6:
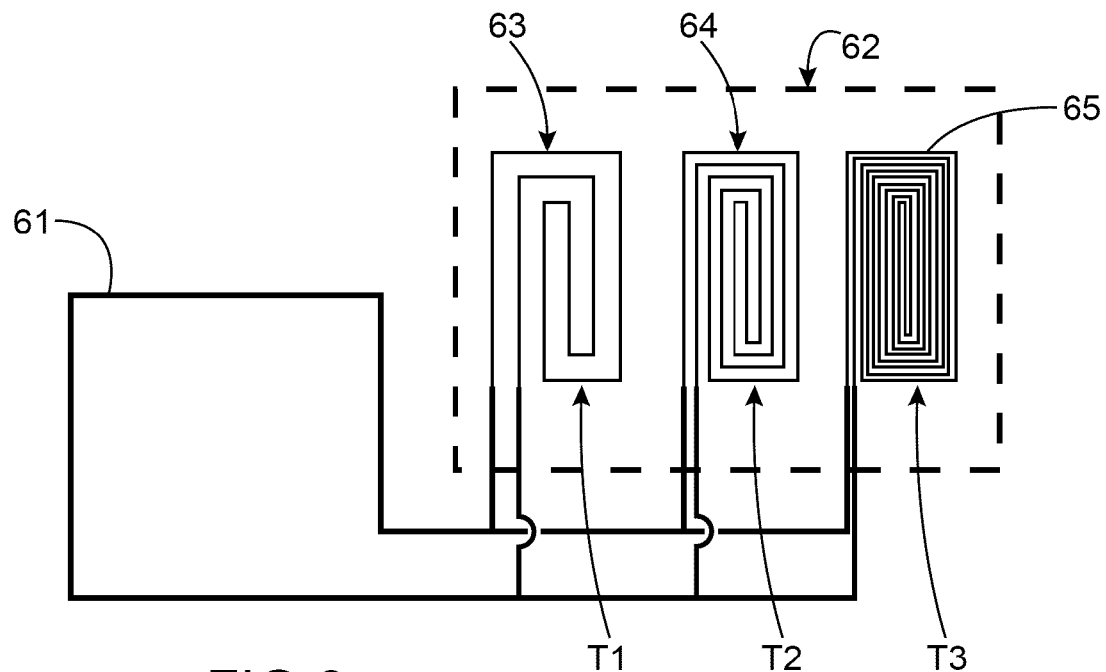
FIG. 6 is a schematic top view of the collecting means and of the resistive heating means of a mold according to the invention in an embodiment where these means are distinct, separate, remote away from each other.

For example, FIG. 6 shows a mold where the collecting antenna (61) is shifted with respect to the printing area (62) and the energy drawn by the collecting antenna (61) is transferred to a series of resistive circuits (63, 64, 65) placed in proximity to the patterns to be printed.

Locally, depending on the patterns to be printed, the temperature of the mold may be controlled by the size, the distance between the resistive elements and the number of resistive elements or by the surface density of the resistive elements, a larger surface density of the resistive element giving a higher temperature of the surface area of the mold located above said resistive element.

This temperature control may be typically achieved by finite elements modeling of the assembly formed by the mold, the resin and the plate supporting this resin. With such a modeling it is possible to locally calculate the electromagnetic energy, for example, the RF energy drawn, the heat flows, the temperature, etc.

Thus, in FIG. 6, the temperature T1 of the patterns located in the area of the surface of the mold above the first heating elements (63) is less than the temperature T2 of the patterns located in the area above the second heating elements (64) which is itself less than the temperature T3 of the patterns located in the area above the further heating elements (65).

Figure 7:
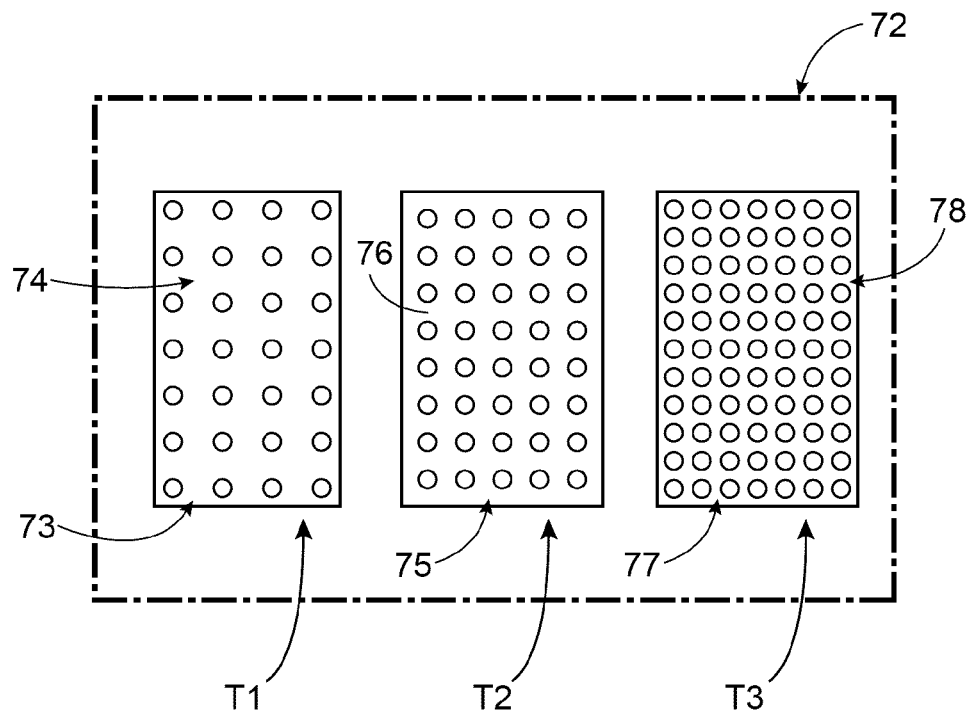
FIG. 7 is a schematic top view of the collecting means and of the resistive heating means of a mold according to the invention in an embodiment where these means are merged.

FIG. 7 shows a mold where the antenna and the heating resistor are merged in the same element, which here assumes the shape of a resistive ring (71) of small dimension, the size of which, defined by the diameter is generally of 1 µm or a few µm (2, 3, 4, 5 microns) up to 10 µm, or even 100 µm, this element being repeated several times in the mold. Locally, the temperature of the mold is controlled here by the density of heating elements.

Thus in FIG. 7, just as in FIG. 6, the temperature T1 of the patterns located in the printing area (72) in an area 1 (73) of the surface of the mold above the first heating elements (74) is less than the temperature T2 of the patterns located in the area 2 (75) of the surface of the mold above the second heating elements (76) which is itself less than the temperature T3 of the patterns located in the area 3 (77) above the third heating element (78). Indeed, the density of the first heating elements located below the area 1 is less than the density of the second heating elements located below the area 2, which is itself less than the density of the third heating elements located below the area 3.

There again, the temperature may locally be controlled by modeling of the type mentioned above. Taking into account that the amount of energy recovered by the collecting loops is proportional to the surface area covered by the whole of the loops, the temperature locally depends on the surface density and on the size of the loops.

In both configurations, the heating elements are insulated from the support by the low heat conductivity layer, membrane (30) for example made of $SiO_2$, $Si_3N_4$ or of other material and locally the temperature may be made more homogeneous by the optional conducting layer (33).

Depending on the density and shape of the elements which will dissipate the energy at the locations where heating is desired, it will be possible to locally adjust the dissipated energy, therefore the heating temperature.

If one takes the example of FIG. 7 above for the three relevant areas (73, 75, 77) (and if a thermally insulating material, for example made of $SiO_2$ is placed between these 3 areas for limiting side diffusion: layer 36 described below), the number of heating elements (which have the shape of loops here) is increased and it will be possible to attain higher heating temperatures from the area 1 (73) as far as the area 3 (77). Therefore, the temperature in the area 3, T3, will be higher than that in the area 2, T2, and than that in the area 1, T1.

Figure 8:
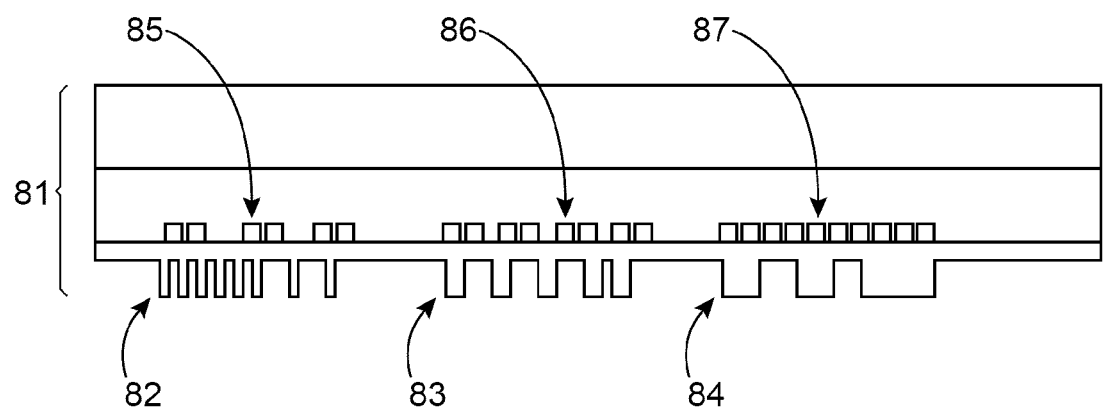
FIG. 8 is a schematic vertical sectional view of a mold according to the invention wherein the patterns to be printed which have increasing sizes from smaller patterns to larger patterns are brought to increasing temperatures T1, T2, and T3.

In FIG. 8, a mold (81) according to the invention is shown in a vertical sectional view, said mold bears patterns to be printed of different sizes (82, 83, 84). The patterns (82) are smaller, finer than the patterns (83) themselves smaller, finer than the patterns (84).

The patterns (82), (83) and (84) are located in areas respectively brought to increasing temperatures T1, T2 and T3 by heating elements (85, 86, 87) with increasing surface area (like in FIG. 6) or with increasing density (like in FIG. 7). Accordingly, the larger patterns (84) brought to the higher temperature T3 decrease the viscosity of the polymer at their contact which is thus less than the viscosity of the polymer in contact with the patterns (83), itself less than the viscosity of the polymer in contact with the patterns (82).

The heating elements are positioned at the surface of a thermally insulating material, i.e. the material of the membrane (30) and are separated laterally from each other by a thermally insulating material, i.e. the material of the layer (36) described below.

An electrically and thermally insulating layer (36) covers said heating means (34) and said second membrane (30). In other words, the electrically and thermally insulating layer (36) covers said heating means (34) in the portions of the surface (35) of the second membrane (30) on which are provided the heating elements (34) or else the surface of the second membrane (30) in the portions of the surface (35) of the second membrane (30) on which no heating elements (34) are provided.

This layer (36) also laterally separates the heating elements (34) from each other. This electrically and thermally insulating layer (36) is generally made of a material selected from $SiO_2$, $Si_3N_4$, $Al_2O_3$, and $HfO_2$. This electrically and thermally insulating layer (36) generally has a thickness from 10 to 500 nm.

The layer (36) is thermally insulating but the patterns (37) are however still heated.

Indeed, the layer (36) is generally sufficiently thin (10 to 500 nm) so that diffusion of heat may reach vertically at the patterns, but the thickness of the layer does not allow lateral diffusion of heat. The major portion of the heat is therefore used for heating the patterns (37) and not the substrate (21).

The mold according to the invention comprises patterns to be printed (37) on said electrically and thermally insulating layer (36) in an area of said layer above said first optional layer (33) and consequently, above said second orifice (28) of said cavity (24).

These patterns (37) of the mold consist of a structuration, for example of a nanostructuration which is compliant with the structuration of the material to be printed such as an organic resin or a mineral material.

The structuration, for example the nanostructuration of the mold, may consist in a periodic network. This periodic network may be a one-dimensional network or a two-dimensional network.

Such a one-dimensional network may, for example, be a network of lines with periodic patterns of period P and of height h. The period P may be from 10 nm to one or a few micrometers, preferably from 100 nm to 1 μm, still preferably from 200 to 600 nm, and the height h may be of at least 5 nm to 500 nm, preferably from 50 nm to 200 nm.

If the network is a two-dimensional network, it may notably be selected from square networks, triangular, rectangular, hexagonal networks, and more complex networks such as Archimedes networks.

The network may also be a network of pads.

It should be noted that the structuration generally has simple non-rounded geometrical patterns. For example, the lines may have a triangular, rectangular, or square cross-section.

It should be noted that the heating means, heating elements (34), are generally quite close to the patterns (37) i.e. the distance between these heating means (34) and these patterns is generally in the range already given above, which may range from 1 to a few nanometers up to 100 to a few hundred nanometers in the direction of the thickness.

Figure 3A:
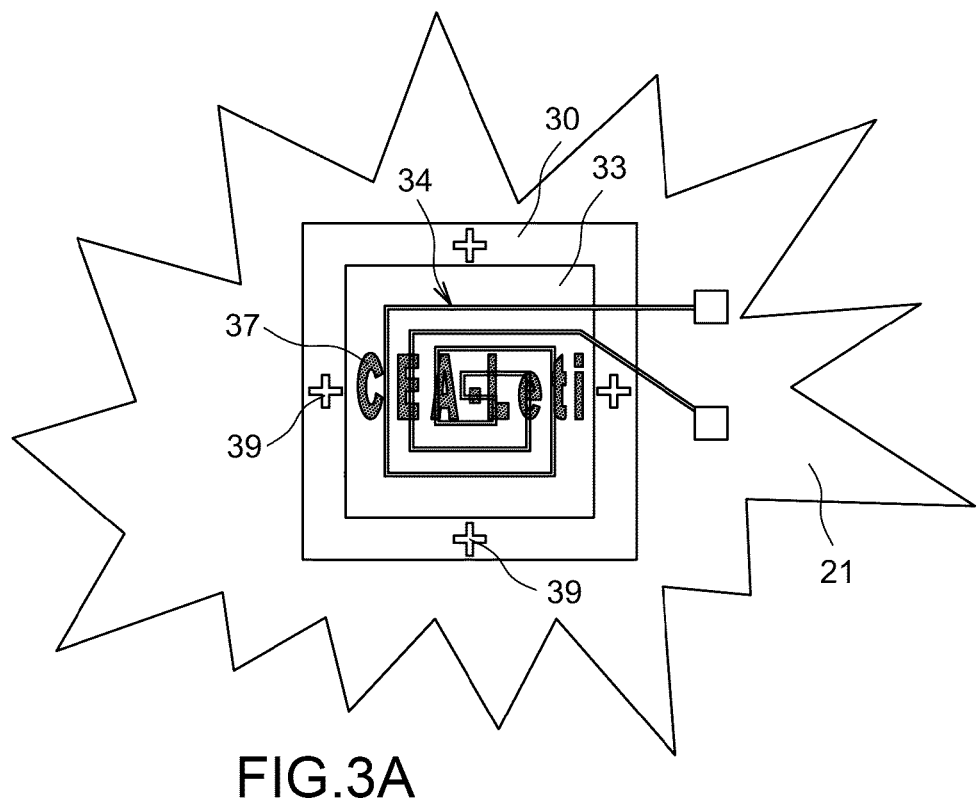
FIG. 3A is a schematic top view of a heating mold according to the invention in the second embodiment thereof, comprising alignment patterns, marks, positioned in the vicinity of the patterns to be printed.
Figure 3B:
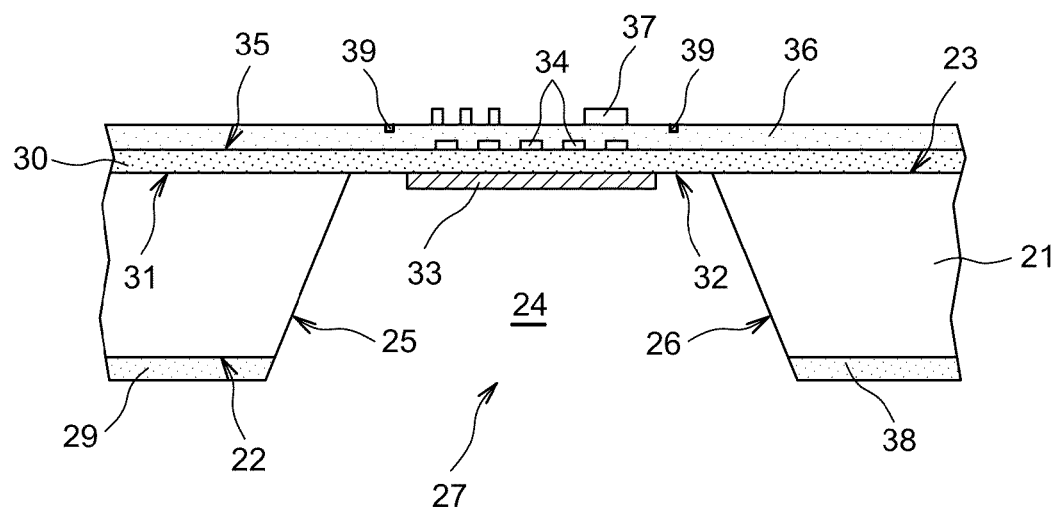
FIG. 3B is a schematic vertical sectional view of a heating mold according to the invention, in the second embodiment thereof comprising, alignment patterns, marks, positioned in the vicinity of the patterns to be printed.

Advantageously, as this is illustrated in FIG. 3A and FIG. 3B, the mold according to the invention may include positioning, alignment marks, structures (39).

These marks, structures (39) may have the shape of a square or of a cross or else they may also assume the form of alignment verniers such as those used in optical lithography for example.

In fact, the selected shape will depend on the software and on the image recognition which will be carried out subsequently, therefore this will depend on the characteristics of the equipment used.

As regards the material of these positioning marks, and because these marks do not necessarily have to heat, materials compatible with micro- and nano-manufacturing processes will advantageously be used.

FIGS. 3A and 3B show alignment marks, structures which are made in the electrically and thermally insulating layer (36) in the vicinity of the patterns to be printed (37).

As this is shown in FIGS. 3A and 3B, these marks may generally be located outside the area of the insulating layer (36) on which are found, located, the patterns to be printed (37).

As this is shown in FIGS. 3A and 3B, these marks may further be located generally above the second orifice (28) but not above the optional layer (33).

The marks will rather be found, located, generally above the fraction of the free portion (32) of the lower face, side (31) of the second membrane (30) which is not covered with the optional layer (33).

Figure 3C:
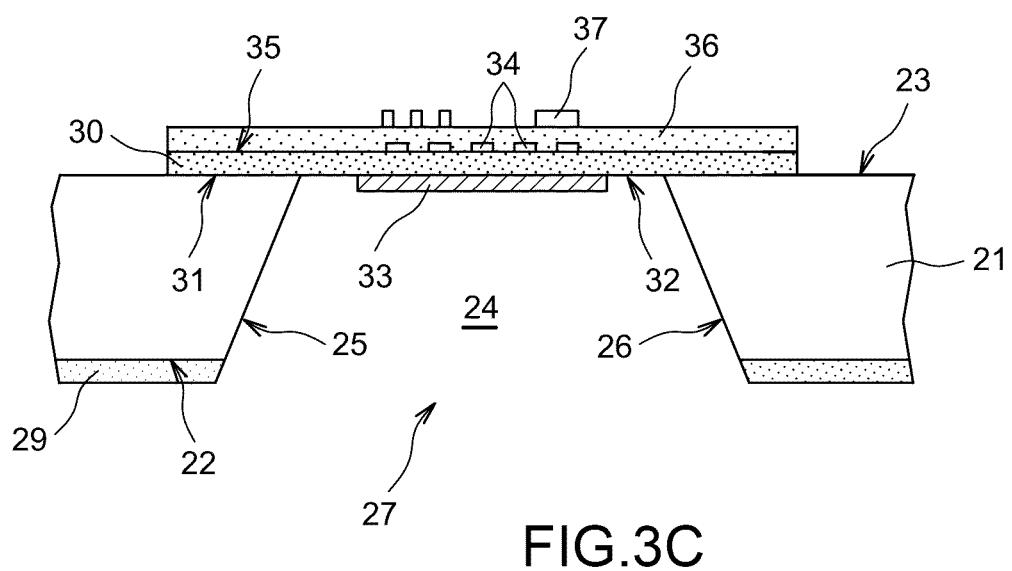
FIG. 3C is a schematic vertical sectional view of a heating mold according to the invention in the second embodiment thereof with a structure comprising <<mesas>>, the membrane (30), the layer (36) and also optionally and preferably the substrate having been etched in order to have a set back non-useful surface.

In FIG. 3C, another embodiment of the heating mold according to the invention is further shown, which is a particular case of the second embodiment, wherein outside the functional area, the layers (30), (36) and also optionally and preferably the substrate (21) have been etched so that the non-useful surface of the substrate is recessed. It may also be stated that <<mesas>> are made.

Such an operation limits the contact surface area of the front face of the mold with the resin, which reduces the defects and makes detachment easier. This configuration of FIG. 3C may also facilitate attachment of the mold on the support of the machine.

More specifically, by <<functional area>> is designated the area of the layers and of the substrate which comprises and/or supports the heating means, heating elements (34), the collecting means, the patterns to be printed (37), and the optional positioning, alignment marks (39, 40).

The layers (36) and (30) are etched over the whole of their thickness and the substrate (21) may be etched over a thickness from one to a few tens of nanometers (for example 20, 30, 40, 50 nm) up to one to a few hundred of nanometers (for example 200, 300, 400, 500 nm) (FIG. 3C).

The different steps of a method for making the mold according to the invention, according to the second embodiment thereof are illustrated in FIGS. 4A to 4H.

Figure 4A:
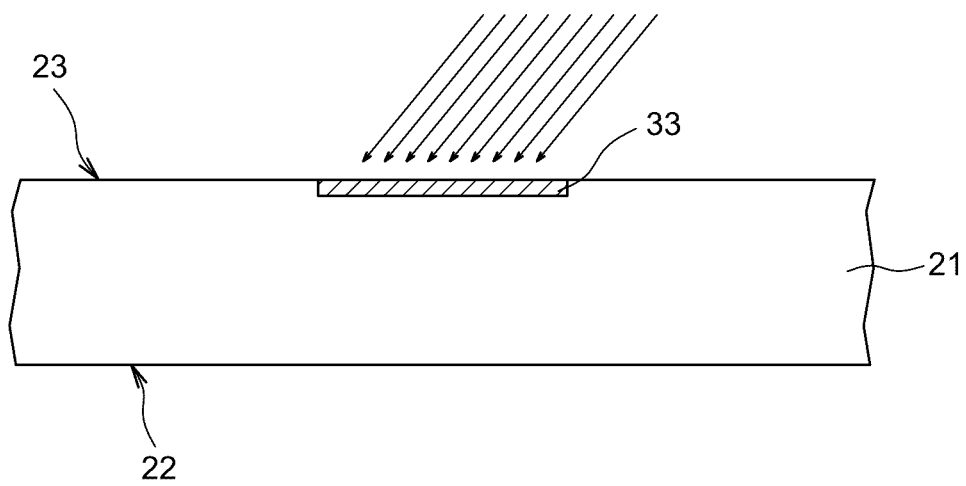
FIGS. 4A to 4H are schematic vertical sectional views which illustrate the successive steps for making a mold according to the invention, in the second embodiment thereof.

In a first step, shown in FIG. 4A, the thermally conducting layer (33) which will be used as a mechanical support for the membrane (30) and which will also allow uniformization of the temperature of the printing area is prepared on the substrate (21) in a defined area of the second surface (which may be an upper surface) of the latter (23).

This layer (33) may be made by carrying out selective doping of the material of the substrate such as silicon, by ion implantation notably with $N^+$ ions and then annealing, or else by diffusion. Thus for example, a SiN layer (33) is obtained.

These strongly doped layers have the property of not being etched during the anisotropic etching of Si.

Figure 4B:
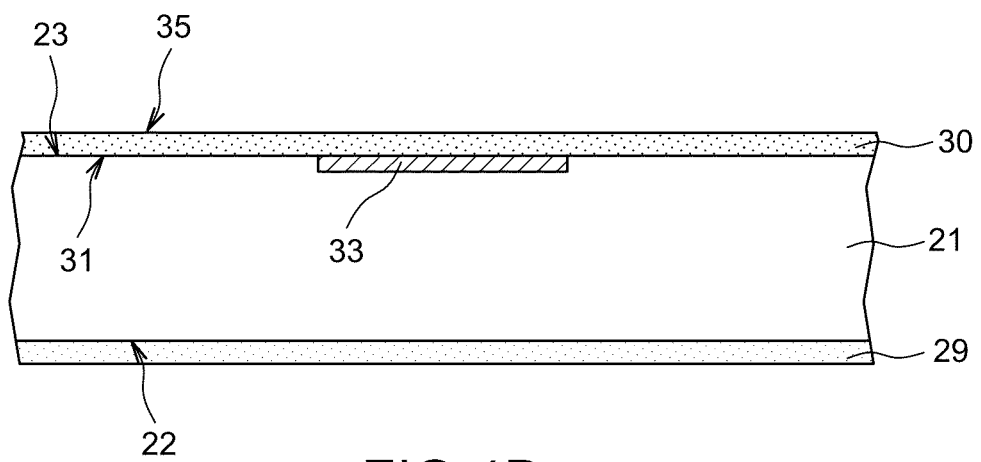

In a second step, shown in FIG. 4B, a membrane layer (29, 30) made of a material (such as $Si_3N_4$) withstanding anisotropic etchings of the material of the substrate is deposited over the totality of the surface of both faces, sides (22, 23) of the substrate (21).

Figure 4C:
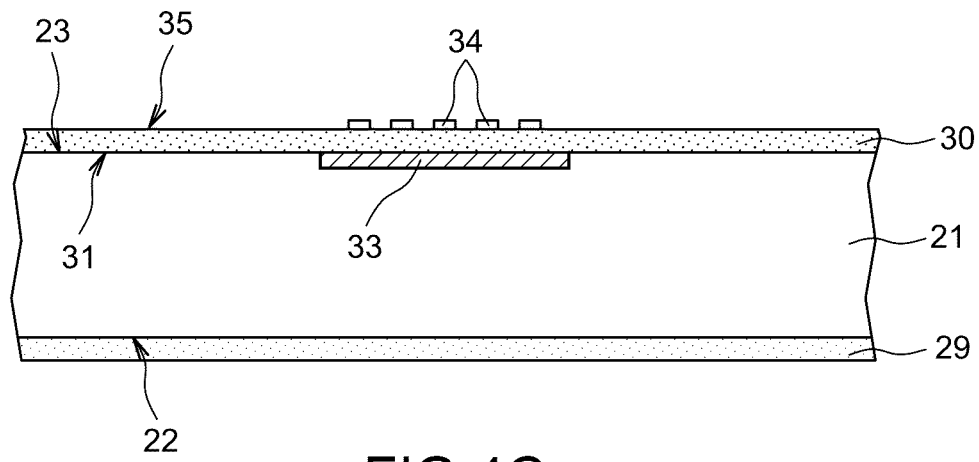

In a third step, shown in FIG. 4C, a resistive heating layer and simultaneously an electromagnetic field collecting, receiving, layer, for example a radiofrequencies collecting, receiving, layer (34), for example made of a metal such as platinum, of titanium nitride or of polysilicon, are deposited on the totality of the upper surface (35) of the second (upper) membrane.

It is then proceeded with the shaping of the resistor and of the electromagnetic field receiver Collector, for example of the radiofrequencies receiver, collector, by photolithography and dry or wet etching. With this shaping, it is possible to give the resistor the intended, optionally optimized, geometry, such as the one (34) shown in FIGS. 2A and 3A.

Figure 4D:
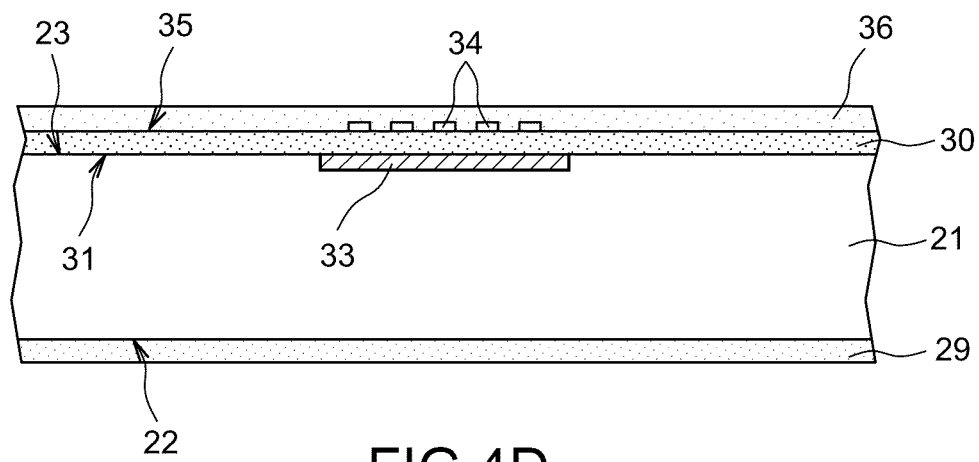

In a fourth step, shown in FIG. 4D, a thermally and electrically insulating layer (36) for example made of a material such as $SiO_2$, $Si_3N_4$, $Al_2O_3$ or $HfO_2$ is deposited on the heating elements (34), on the collecting elements and on the second membrane layer (30). This insulating layer (36) may optionally consist in several layers, each of these layers optionally being made of a different material.

At the end of the deposition of the insulating layer (36), a planarization treatment of the deposited layer is generally carried out by chemical and mechanical polishing (CMP).

Figure 4E:
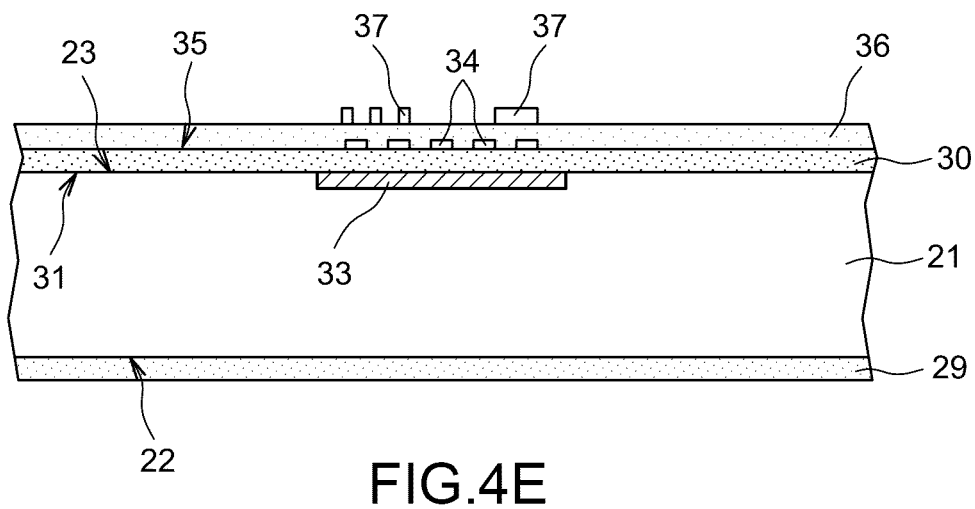
Figure 4F:
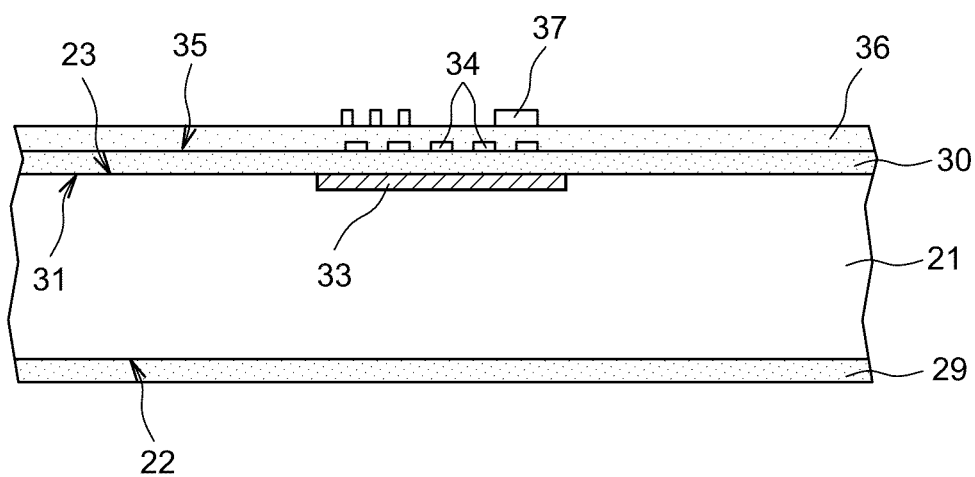

In a fifth step, shown in FIG. 4E, the patterns to be printed (37) (structurations, nano-structurations) are made on the insulating layer (36). Advantageously, these patterns (37) are made by structuration of a thin layer for example made of Si, $SiO_2$, $Si_3N_4$, $Al_2O_3$, $HfO_2$ or of a multilayer, generally by photolithography and selective etching.

Figure 4G:
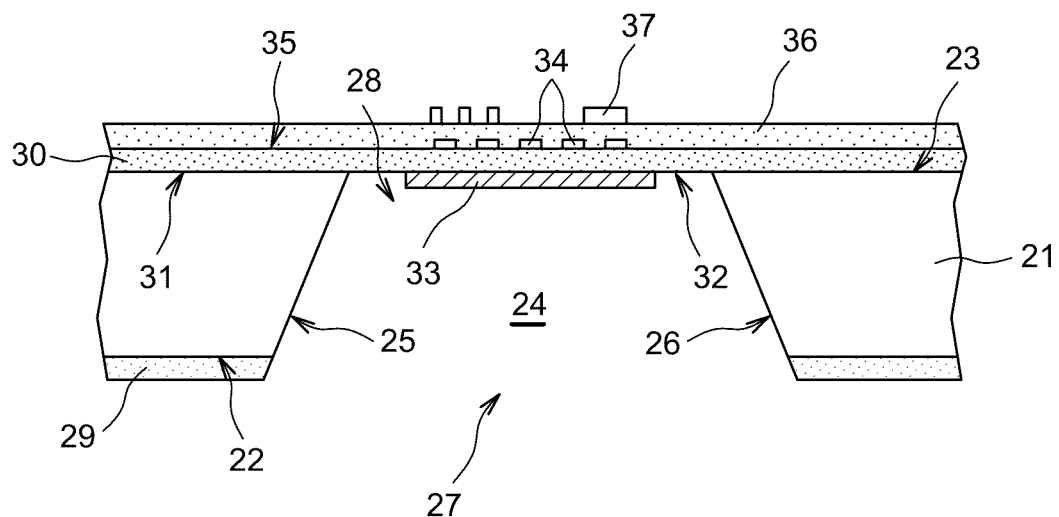

In a sixth step, shown in FIG. 4G, the lower membrane (29) or protective layer, for example made of $Si_3N_4$, is generally first of all structured by lithography and dry etching. Subsequently, the upper membrane (30) is released by anisotropic etching, for example with potash KOH or tetramethylammonium hydroxide TMAH or TMAOH, of the material of the substrate (21) from the lower surface or rear face (22) of this substrate.

The method may optionally comprise a seventh step if it is desired to make a substrate such as the one illustrated in FIGS. 3A and 3B during which positioning, alignment marks (39) are made for example in the insulating layer (36) in the vicinity of the patterns to be printed (37).

Generally, the marks (39) may be made at the end or at the same time as the making of the layers (30), (34) and of the patterns (37). They may be made in the layer (30) or in the layer (36) or even at the level of the patterns (37) (provided that the size of these marks (39) is less than the size of the patterns (37)): it is this embodiment which is shown in FIG. 3B.

The marks may optionally be raised or recessed, in other words, the marks may be bumps or holes.

Figure 4H:
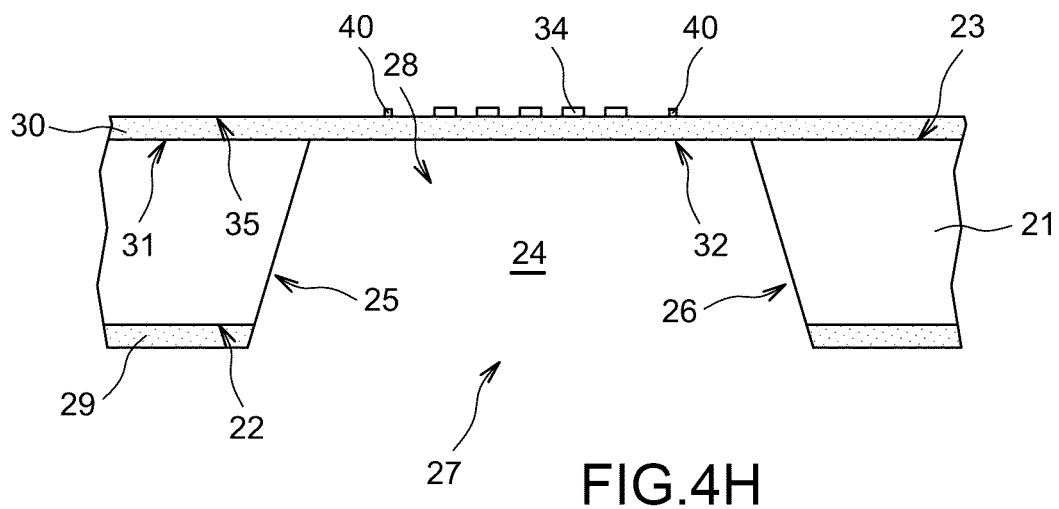

FIG. 4H is an alternative version of the third step shown in FIG. 4C, wherein a series of positioning, alignment marks (40) are made on the upper membrane layer (30) in the vicinity of the shaped heating elements (34). These marks (39, 40) may then be used for aligning the structures on the preceding levels.

The manufacturing method then follows the same steps as the ones described earlier (FIGS. 4D to 4G).

Generally, these marks (39, 40) may be made during the shaping of the heating resistor by structuring the conducting layer (34) itself, but they may also be superposed on the surface of the mold, generally on the layer (36), by depositing an opaque layer, such as for example a silicon layer, which is then structured by a lithography and selective etching step in order to give the marks (39, 40).

Figure 9:
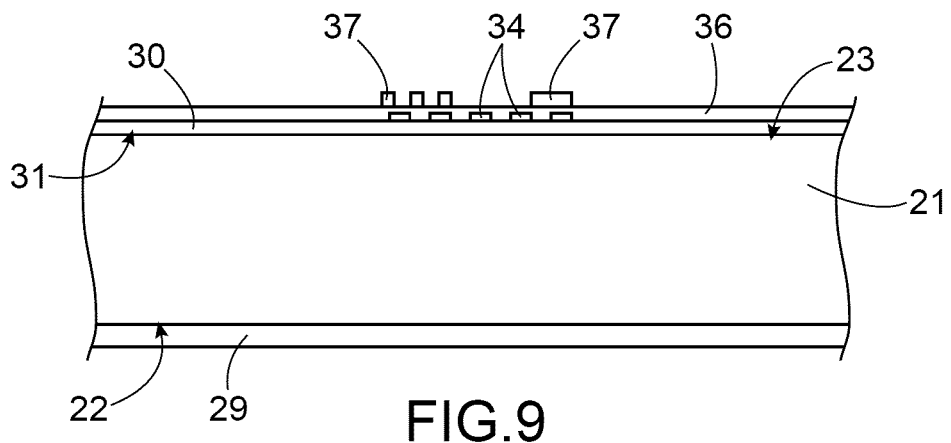
FIG. 9 is a schematic vertical sectional view of a heating mold according to the invention, in the first embodiment thereof.

We shall now describe the first embodiment of the mold according to the invention which is illustrated in FIG. 9.

For the sake of simplification and coherence, the same references as those used in the figures which describe the second embodiment have been used in FIG. 9.

This mold comprises a substrate (21) including a first main surface (22) and a second main surface (23).

In FIG. 9, the first (22) and second (23) main surfaces are planar, parallel and horizontal. The first main surface (22) may therefore be defined as a lower surface, while the second main surface (23) may be defined as an upper surface. It is quite obvious that this arrangement of the first main surface (22) and of the second main surface (23) is only given as an example and that other arrangements of both of these surfaces may be contemplated.

The substrate (21) may thus have the shape of a plate or platelet (wafer) comprising two planar, parallel, for example square, rectangular or further circular surfaces (22, 23).

The thickness of the substrate (21), i.e. the distance between the first main surface (22) of the substrate (21) and the second main surface (23) of the substrate (21) is typically comprised between 350 and 735 µm depending on the thickness of the selected substrate.

The material of the substrate (21) has already been described above within the scope of the second embodiment.

The first main surface (22) is optionally covered with a first membrane (29) (in FIG. 9, this is a lower membrane).

This first membrane (29) when it is present may cover totally or partly the first main surface (22) of the substrate.

The first membrane (29) is not essential.

A second membrane (30) (in FIG. 9, this is an upper membrane) lies through one of its faces, sides (31), i.e. the lower face, side in the case of FIG. 9, on said second main surface (23) of the substrate (21).

This second membrane (30) totally or partly covers said second surface (23).

The second membrane (30) may be defined as a support on which the layer (36) containing the heating means (34) is positioned and which is surmounted by the patterns (37). This membrane (30) is electrically and thermally insulating since the heating elements (34), which generally have to be quite close to the patterns (37) are embedded in this membrane (30), and/or in the layer (36).

It is equivalent, both from the point of view of the making of the mold, and from the point of view of its use, that the heating elements (34) are embedded in the membrane (30), or else the heating elements are embedded in the layer (36).

A general crucial point is that the upper surface of the layer (36) is planar.

By <<quite close>>, is generally meant that the heating elements (34) are generally located at a distance of one to a few nanometers (for example 2, 3, 5, 10, 20) up to 100 to a few hundred nanometers (for example 200, 300, 500, 1,000, 2,000 nm) from the patterns (37).

Said first and second membranes (29, 30) generally have a thickness from 100 to 200 nm.

The lower face (31) of said second membrane (30), on the side of the second main surface (23) of the substrate (21) optionally includes a heat conducting layer.

This layer (33) is generally made of a material selected from Si, metals and semiconductors, for example the layer (33) may be made of Si or of TiN. The layer (33) generally has a thickness from 500 nm to 5 µm.

The layer (33) is not essential. The layer (33) is heat conducting and non-insulating in order to uniformize the heat over the whole surface underneath the heating means (34). But it may be desirable to add an insulating layer (not shown) underneath this layer (33) and above the substrate in order to avoid convection and so that the heat does not diffuse too much in the substrate (21).

This first layer (33) only generally covers a fraction of the lower face (31) of the second membrane (30), it is generally placed at the centre of said lower face, side, and correspondingly to the heating elements and to the patterns.

Heating means (34) are deposited on the other one of the faces (35) of said membrane (30), in an area of said second membrane above said first optional layer (33). These heating means, elements (34) consist generally in a resistive heating layer covering at least partly said area. This resistive heating layer (34) generally has a thickness from 10 to 500 nm.

For the description of the heating means, reference may be made to the description of the second embodiment of the mold according to the invention which has already been made above. Indeed, the description of the heating means of the first embodiment of the mold entirely applies to the second embodiment of the mold according to the invention.

In the same way, for the description of the electromagnetic field collecting means, reference may be made to the description of the second embodiment of the mold according to the invention which has been made above. Indeed, the description of the magnetic field collecting means of the first embodiment of the mold entirely applies to the second embodiment of the mold according to the invention.

An electrically and thermally insulating layer (36) covers said heating means (34) and said collecting means (if these collecting means are in the same plane, as the resistive heating means) and said second membrane (30). In other words, the electrically and thermally insulating layer (36) covers said heating means (34) in the portions of the surface (35) of the second membrane (30) on which are provided the heating elements (34), or else the surface of the second membrane (30) in the portions of the surface (35) of the second membrane (30) on which no heating elements (34) and no electromagnetic field collecting elements are provided.

This electrically and thermally insulating layer (36) is analogous to that of the second embodiment and reference may be made to the description which has already been made above of this layer.

The mold according the invention in this first embodiment, comprises patterns to be printed (37) on said electrically and thermally insulating layer (36) in an area of said layer above said first optional layer (33).

These patterns (37) are analogous to those of the second embodiment and reference may be made to the description which has already been made above of these patterns.

Advantageously, the mold according to the invention may include in this first embodiment, positioning, alignment marks, structures.

These positioning, alignment marks, structures are analogous to those of the second embodiment and it is possible to refer to the description which has already been made above of these positioning, alignment marks, structures.

As in the particular case of the second embodiment, illustrated in FIG. 3C, outside the functional area, the layers (30), (36) and also optionally and preferably substrate (21) may be etched so that the non-useful surface of the substrate is recessed. It is also possible to say that <<mesas>> are made.

The different steps of the method for making the mold according to the invention, in its first embodiment, are illustrated in FIGS. 10A to 10H.

It is optionally possible before the first step to make a layer (33) as in FIG. 4A.

Figure 10A:
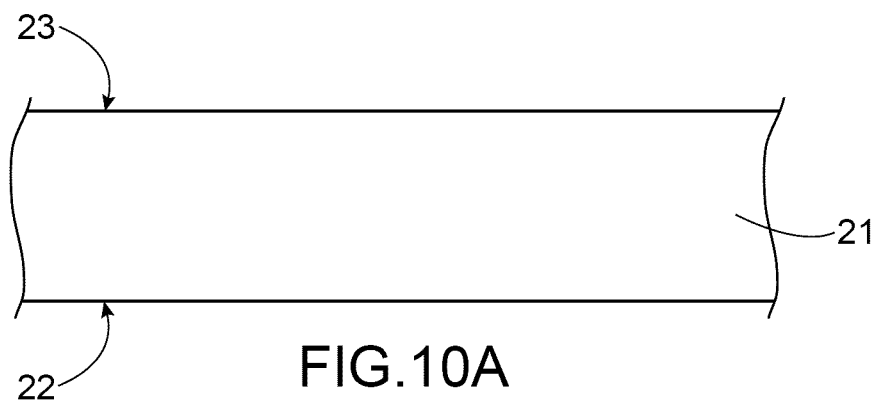
FIGS. 10A to 10E are schematic vertical sectional views which illustrate the successive steps for making a mold according to the invention, in the first embodiment thereof.
Figure 10B:
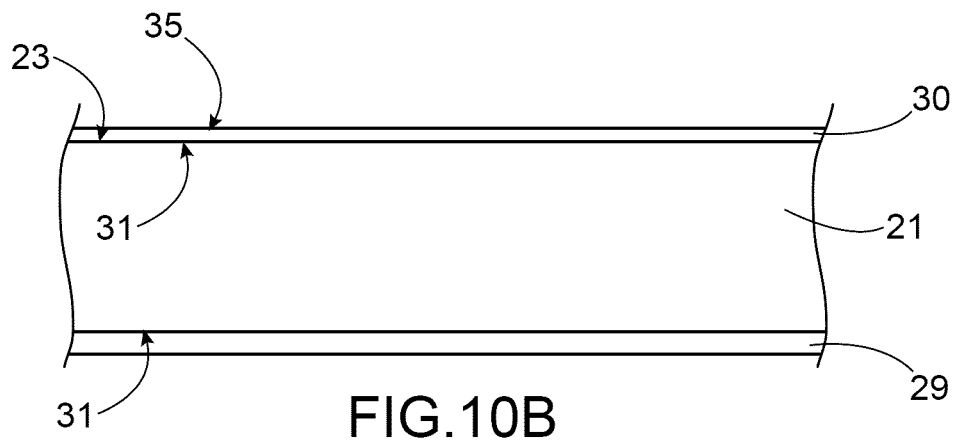

In a first step, shown in FIG. 10B a membrane layer (29, 30) made of a material (such as a $Si_3N_4$) withstanding anisotropic etchings of the material of the substrate is deposited on the totality of the surface of both faces (22, 23) of the substrate (21).

Figure 10C:
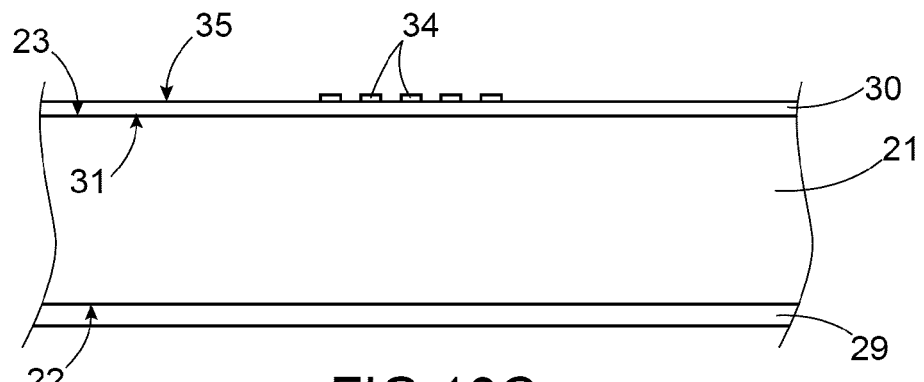

In a second step, shown in FIG. 10C, a resistive heating layer and simultaneously an electromagnetic field collecting, receiving layer, for example a radiofrequencies collecting, receiving layer (34), for example made of a metal such as platinum, titanium nitride or of polysilicon is deposited on the totality of the upper surface (35) of the second (upper) membrane.

It is then proceeded with the shaping of the resistor and of the electromagnetic field collector, receiver for example a radiofrequencies collector, receiver, by photolithography and dry or wet etching.

With this shaping, it is possible to give the resistor the intended geometry, optionally optimized, as the one shown (34) in FIGS. 2A and 3A.

Figure 10D:
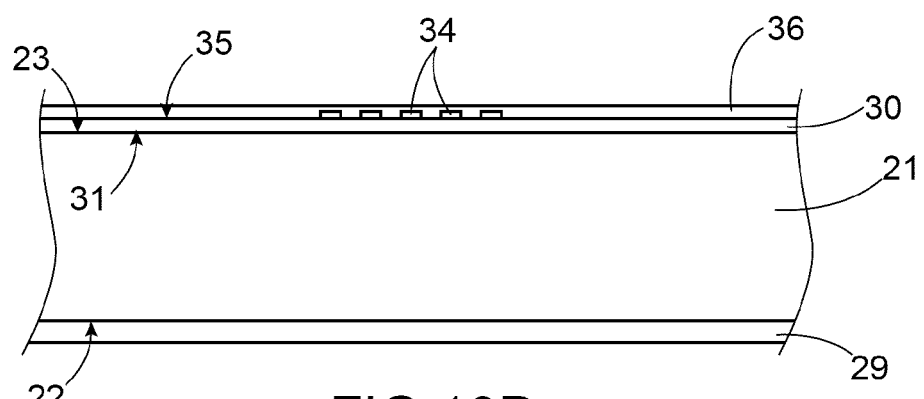

In a third step, shown in FIG. 10D, a thermally and electrically insulating layer (36) for example made of a material such as $SiO_2$, $Si_3N_4$, $Al_2O_3$ or $HfO_2$ is deposited on the heating elements (34), on the collecting elements, and on the second membrane layer (30). This insulating layer (36) may optionally consist in several layers, each of these layers optionally being made of a different material.

At the end of the deposition of the insulating layer (36), a planarization treatment of the deposited layer is generally carried out by chemical-mechanical polishing (CMP).

Figure 10E:
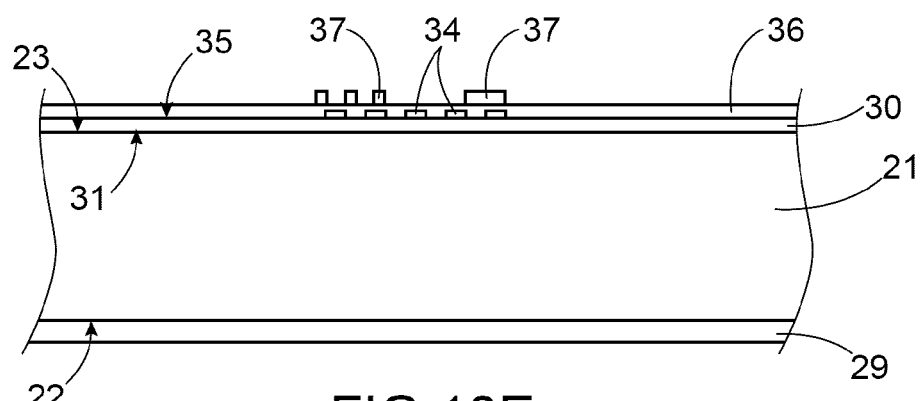

In a fourth step, shown in FIG. 10E, the patterns to be printed (37) (structurations, nanostructurations) are made on the insulating layer (36).

Advantageously, these patterns (37) are made by structuration of a thin layer for example made of Si, $SiO_2$, $Si_3N_4$, $Al_2O_3$, $HfO_2$ or of a multilayer, generally by photolithography and selective etching.

The method may optionally comprise a fifth step if making a substrate analogous to the one illustrated in FIGS. 3A and 3B is desired, during said step positioning, alignment marks (39) are made, for example in the insulating layer (36) in the vicinity of the patterns to be printed (37).

For the description of this step for making the marks, reference may be made to the description which was made earlier within the scope of the second embodiment of the mold according to the invention.

The invention also relates to a thermal nanoimprint lithography device which integrates the mold according to the invention. The mold according to the invention may be integrated into a novel device specially designed for its application but it may easily be integrated in an existing device even if nothing is provided in such devices for applying the mold according to the invention. It will be sufficient, in order that the existing devices may operate with the molds according to the invention, provided with electromagnetic radiation collecting means, that these devices be provided with at least one source of electromagnetic radiation.

Figure 11A:
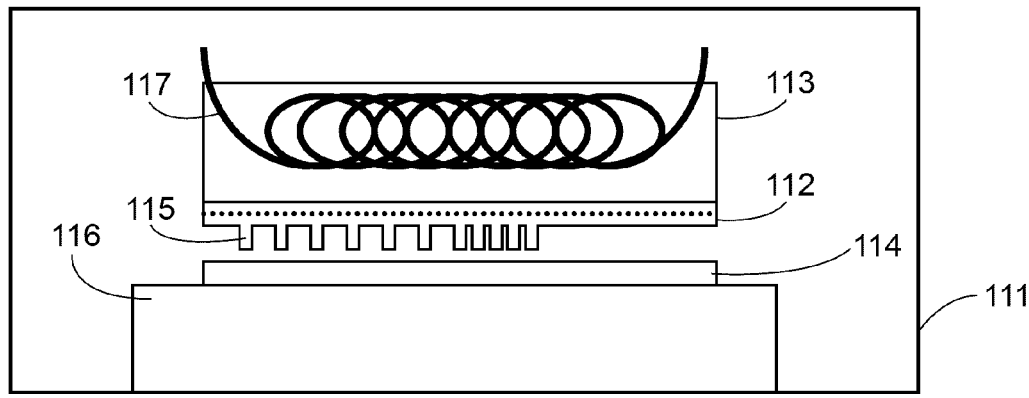
FIGS. 11A to 11C are schematic vertical sectional views of three embodiments of a thermal nanoimprint lithography device according to the invention in which a source which emits an electromagnetic field is respectively positioned, located, in the piston (FIG. 11A), in the printing chamber (FIG. 11B), or in the support of the plate to be printed (FIG. 11C).
Figure 11B:
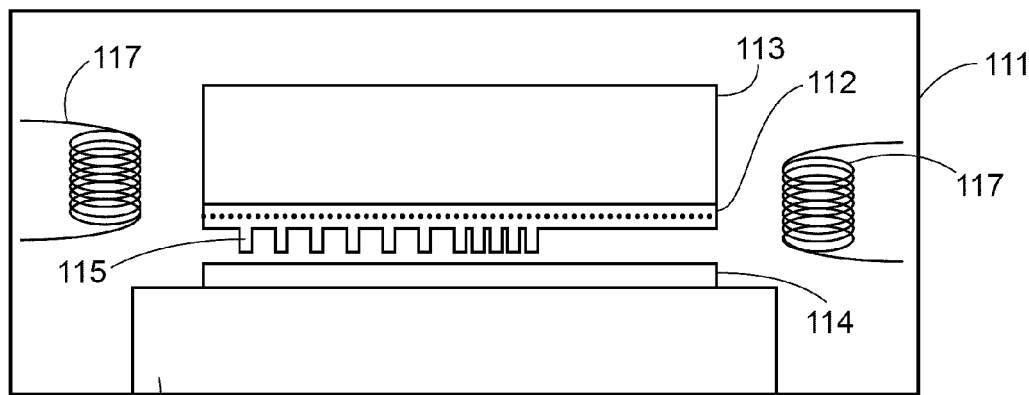
Figure 11C:
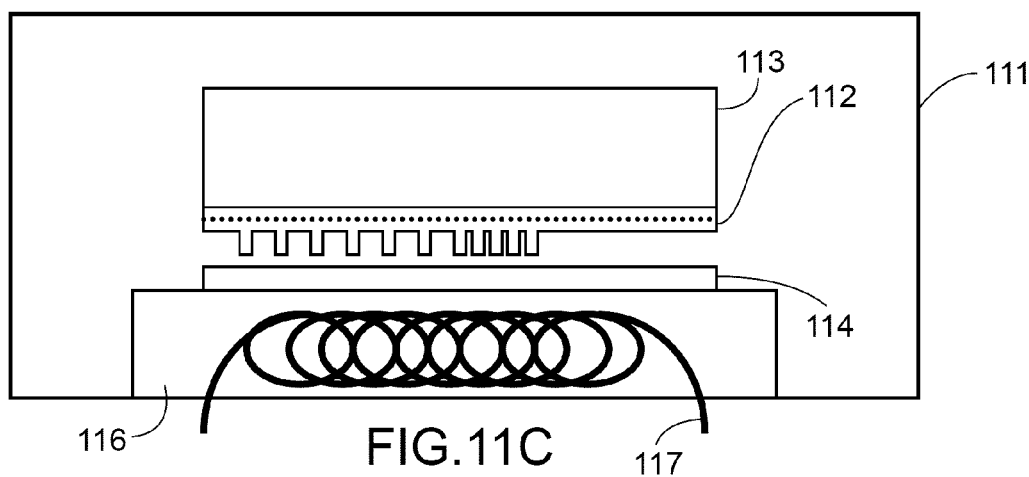

The device according to the invention is illustrated in FIGS. 11A to 11C.

This device comprises a printing chamber (111) inside which are found:

a mold according to the invention (112) as described above, comprising patterns to be printed (115) said mold being supported by a piston (113). The whole of the mold with its heating elements and the piston forms a printing head;

a polymer or resin plate (114) facing said patterns to be printed (115) of said mold, said plate (114) being supported by an, optionally heating, plate support (116);

and at least one source (117) which emits an electromagnetic field.

The sources(s) which emits(s) an electromagnetic field such as a radiofrequency source, may be integrated into the device of the invention according to at least three embodiments.

In a first embodiment, illustrated in FIG. 11A, one or more sources (117) is (are) integrated into the printing head, and more specifically into the piston which is used for applying pressure.

In a second embodiment, illustrated in FIG. 11B, one or more sources (117) is (are) positioned inside the printing chamber, in the free space of the latter, outside the printing head, of the plate support and of the plate. Thus, in FIG. 11B, two sources (117) placed inside the printing chamber (111) have been illustrated as an example, but a single source or several sources may be placed inside the printing chamber (111).

In a third embodiment, illustrated in FIG. 11C, one or more sources (117) are integrated into the plate support (116).

Depending on the equipment used and its complexity, one of these embodiments or any combination of two or three of these embodiments may be applied.

The mold according to the invention may be used in a method for making a substrate comprising a surface nanostructured by a thermal nanoimprint lithography technique.

Such a method may for example comprise the following successive steps:

a) a layer of an organic resin or of a mineral material with a low melting temperature is deposited on a planar surface of a substrate;

b) the organic resin is heated up to a temperature greater than or equal to its glass transition temperature Tg or its melting temperature, or the mineral material is heated up to a temperature greater than or equal to its melting temperature and the organic resin or liquid mineral material layer is printed with the mold according to the invention having a nanostructuration, by means of which the organic resin or mineral material layer is provided with a first nanostructuration compliant with the nanostructuration of the mold;

c) the temperature of the organic resin or of the mineral material is lowered down to a temperature at which it is solid;

d) the mold is separated from the organic or mineral material layer firmly attached to the substrate.

What is claimed is:

1. A heating mold for thermal nanoimprint lithography comprising:

a substrate including a first main surface and a second main surface, and a first membrane lying through a first of its sides on said second main surface and at least partially covering said second main surface, the first membrane being an electrically and thermally insulating membrane;

a resistive heating element on the other one of the sides of said second membrane in an area of said first membrane;

an electrically and thermally insulating layer which covers said resistive heating element and at least partially covers said first membrane;

at least one pattern printed on said electrically and thermally insulating layer in an area of the surface of said electrically and thermally insulating layer above said heating element; and a collecting element configured to collect electromagnetic energy of a variable electromagnetic field emitted by a source located outside the mold, said collecting element being connected to said resistive heating element through which said electromagnetic energy is dissipated.

2. The mold according to claim 1, wherein said first and second main surfaces are planar and parallel.

3. The mold according to claim 1, wherein said first and second main surfaces are horizontal.

4. The mold according to claim 1, further comprising positioning alignment marks.

5. The mold according to claim 4, wherein said alignment marks are located in the first membrane layer and/or in the electrically and thermally insulating layer and/or on said electrically and thermally insulating layer in the vicinity of said at least one pattern.

6. The mold according to claim 1, wherein said collecting element includes one or several radio frequency receivers or antennas for collecting radio frequencies (RF).

7. The mold according to claim 1, wherein said resistive heating element and said collecting element are distinct and connected through a conveying element configured to convey energy.

8. The mold according to claim 7, wherein said collecting element is located in a same plane as said resistive heating element on the other of the sides of said first membrane and outside the area where said resistive heating element is located.

9. The mold according to claim 7, wherein said collecting element is located in a different plane from the plane of said resistive heating element.

10. The mold according to claim 1, wherein the resistive heating element, or a merged resistive heating element and collecting element comprise several discrete, distinct heating elements separated from each other by said electrically and thermally insulating layer and/or the first membrane, and at least one of the shape, the size, and the density of said heating elements is (are) selected so as to locally adjust or locally set the heating temperature of said electrically and thermally insulating layer and of the at least one pattern located on the surface.

11. The mold according to claim 10, wherein the at least one pattern comprises patterns having different sizes located on different areas of the surface of the electrically and thermally insulating layer, and wherein at least one of the shape, the size, and the density of the heating elements is (are) selected so that the areas of the surface of the electrically and thermally insulating layer on which the patterns of a relatively larger size are located, are heated to a higher temperature than the areas of the surface of the electrically and thermally insulating layer on which the patterns having a relatively smaller size are located.

12. The mold according to claim 7, wherein said collecting element comprises a material selected from the group consisting of Cu, Al, Pt, Ta, and TiN.

13. The mold according to claim 1, wherein the substrate is made of a material selected the group consisting of silicon, silicon oxide, silicon nitride, germanium, sapphire, GaAs, and composite materials including combinations thereof.

14. The mold according to claim 1, wherein, when the substrate comprises silicon, the first membrane is made of a material selected from the group consisting of $Si_3N_4$ and $SiO_2$.

15. The mold according to claim 1, wherein the resistive heating element is made of a material selected from the group consisting of platinum, tantalum, tungsten, titanium nitride, doped monocrystalline and polycrystalline silicon.

16. The mold according to claim 1, wherein the electrically and thermally insulating layer is made of a material selected from the group consisting of $SiO_2$, $Si_3N_4$, $Al_2O_3$ and $HfO_2$.

17. The mold according to claim 1, wherein the at least one pattern is made of a material selected from the group consisting of Si, $SiO_2$, $Si_3N_4$, $Al_2O_3$ and $HfO_2$.

18. A device for thermal nanoimprint lithography comprising a printing chamber comprising:
a mold according to claim 1, comprising at least one printed pattern, said mold being supported by a piston;
a plate support capable of supporting a plate made of a polymer or a resin facing said at least one printed pattern of said mold;
and at least one source configured to emit an electromagnetic field.

19. The device according to claim 18, wherein the at least one source is integrated into the piston and/or the at least one source is integrated into the plate support and/or the at least one source is positioned in the printing chamber outside the mold, the piston and the plate support.

20. A method for manufacturing a mold according to claim 1 comprising the following successive steps:
providing a substrate including a first main surface and a second main surface;
depositing a first electrically and thermally insulating membrane on said second main surface;
depositing a resistive heating and electromagnetic energy collecting layer on an area of the first membrane above the thermally conducting and mechanically supporting layer;
shaping the resistive heating and electromagnetic energy collecting layer;
depositing an electrically and thermally insulating layer on said resistive heating and electromagnetic energy collecting layer and on the first membrane; and
forming at least one pattern for printing on said electrically and thermally insulating layer.

21. The method according to claim 20, wherein alignment and positioning marks are formed in at least one of the membrane layer, the insulating layer, and said electrically and thermally insulating layer in the vicinity of the at least one pattern.

22. A method for preparing a substrate comprising a surface nanostructured by a thermal nanoimprint lithography technique wherein
a heating mold for thermal nanoimprint lithography is applied, the heating mold comprising:
a substrate including a first main surface and a second main surface, and a first membrane lying through a first of its sides on said second main surface and at least partially covering said second main surface, the first membrane being an electrically and thermally insulating membrane;
a resistive heating element on the other one of the sides of said first membrane in an area of said first membrane;
an electrically and thermally insulating layer which covers said resistive heating element and at least partially covers said first membrane;
at least one pattern printed on said electrically and thermally insulating layer in an area of the surface of said electrically and thermally insulating layer above said heating element; and
a collecting element configured to collect electromagnetic energy of a variable electromagnetic field emitted by a source located outside the mold, said collecting element being connected to said resistive heating element through which said electromagnetic energy is dissipated.

23. The method of claim 20, further comprising:
forming a thermally conducting and mechanically supporting layer in an area of the second main surface of the substrate.

24. The mold according to claim 1, wherein said first main surface is at least partly covered by a second membrane.

25. The mold according to claim 1, comprising a thermally conducting layer for mechanically supporting the first membrane on at least one portion of said first side of the first membrane and above said substrate.

26. The mold according to claim 25, comprising an insulating layer under said thermally conducting layer and mechanically supporting layer.

27. The method of claim 23, further comprising depositing a second membrane on said first main surface.

28. The mold according to claim 24, wherein, when the substrate comprises silicon, the second membrane is made of a material selected from the group consisting of $Si_3N_4$ and $SiO_2$.

* * * * *